(12) United States Patent
Tanaka et al.

(10) Patent No.: US 12,394,465 B2
(45) Date of Patent: Aug. 19, 2025

(54) MEMORY DEVICE

(71) Applicant: Kioxia Corporation, Tokyo (JP)

(72) Inventors: Reika Tanaka, Yokohama Kanagawa (JP); Kensuke Ota, Yokohama Kanagawa (JP); Masamichi Suzuki, Koto Tokyo (JP)

(73) Assignee: Kioxia Corporation, Tokyo (JP)

( * ) Notice: Subject to any disclaimer, the term of this patent is extended or adjusted under 35 U.S.C. 154(b) by 97 days.

(21) Appl. No.: 18/456,430

(22) Filed: Aug. 25, 2023

(65) Prior Publication Data

US 2024/0087633 A1 Mar. 14, 2024

(30) Foreign Application Priority Data

Sep. 9, 2022 (JP) .................. 2022-143683

(51) Int. Cl.
*G11C 11/22* (2006.01)

(52) U.S. Cl.
CPC ...... *G11C 11/2275* (2013.01); *G11C 11/2273* (2013.01); *G11C 11/2297* (2013.01)

(58) Field of Classification Search
CPC ............ G11C 11/2275; G11C 11/2273; G11C 11/2297; G11C 11/22; G11C 11/2255; G11C 11/2257; G11C 11/223
See application file for complete search history.

(56) References Cited

U.S. PATENT DOCUMENTS

| | | | | |
|---|---|---|---|---|
| 6,157,563 A | * | 12/2000 | Hirano | .................... G11C 11/22 365/145 |
| 10,127,964 B2 | | 11/2018 | Sun | |
| 10,636,468 B2 | | 4/2020 | Higashi | |
| 10,991,411 B2 | * | 4/2021 | Villa | ...................... G11C 11/221 |
| 2004/0109363 A1 | * | 6/2004 | Hamada | .................. G11C 11/22 365/200 |
| 2021/0376154 A1 | | 12/2021 | Lin | |
| 2022/0093152 A1 | * | 3/2022 | Tanaka | .................. G11C 11/223 |
| 2023/0058938 A1 | * | 2/2023 | Debashis | ................ G11C 11/54 |
| 2024/0221829 A1 | * | 7/2024 | Tortorelli | ........... G11C 13/0026 |

FOREIGN PATENT DOCUMENTS

JP 7005398 B2 2/2022

\* cited by examiner

*Primary Examiner* — Jay W. Radke
(74) *Attorney, Agent, or Firm* — Kim & Stewart LLP

(57) ABSTRACT

According to one embodiment, a memory device includes a pillar extending in a first direction through a first, second, and third conductive layers. The pillar includes ferroelectric layer. A first transistor is at an intersection of the pillar and the first conductive layer. A second transistor is at an intersection of the pillar and the second conductive layer. A ferroelectric memory cell is at an intersection with the third conductive layer and the pillar. A circuit supplies a read pulse to the memory cell in a read sequence. The read pulse has a first voltage value in a first period and has a second voltage value with the same polarity as the first voltage value in a second period after the first period. The second voltage value is lower than the first.

20 Claims, 14 Drawing Sheets

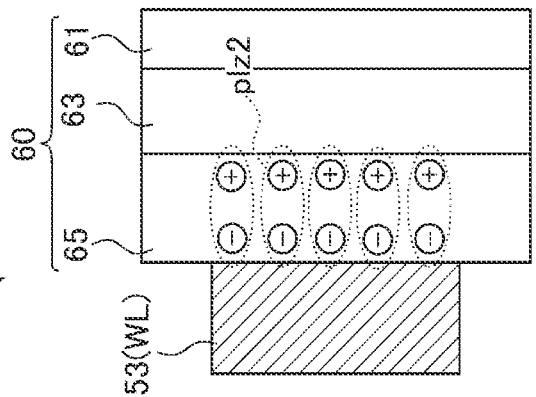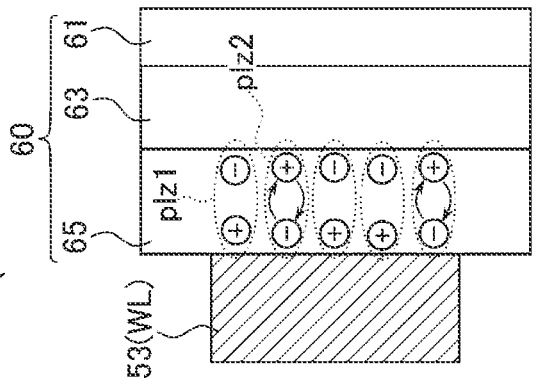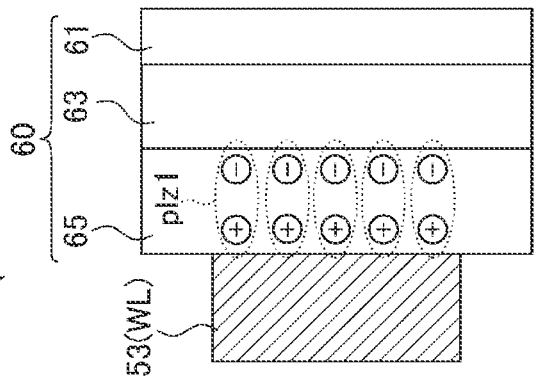

MEMORY DEVICE

CROSS-REFERENCE TO RELATED APPLICATION(S)

This application is based upon and claims the benefit of priority from Japanese Patent Application No. 2022-143683, filed Sep. 9, 2022, the entire contents of which are incorporated herein by reference.

FIELD

Embodiments described herein relate generally to a memory device.

BACKGROUND

Memory devices storing data using polarization characteristics of ferroelectrics have been proposed.

BRIEF DESCRIPTION OF THE DRAWINGS

FIGS. 7A to 7C are diagrams illustrating aspects related to an operation of a memory device according to a first embodiment.

DETAILED DESCRIPTION

Embodiments provide a memory device having improved reliability.

In general, according to one embodiment, a memory device includes a first conductive layer above a substrate in a first direction, a second conductive layer between the first conductive layer and the substrate, and a third conductive layer between the first conductive layer and the second conductive layer. A pillar extends in the first direction and includes a ferroelectric layer. The pillar is adjacent to the first, second, and third conductive layers in a second direction perpendicular to the first direction. A first transistor is at an intersection of the first conductive layer and the pillar. A second transistor is at an intersection of the second conductive layer and the pillar. A memory cell is at an intersection of the third conductive layer and the pillar. The memory cell comprises a ferroelectric transistor. A circuit is configured to supply a read pulse to the memory cell in a read sequence. The read pulse has a first voltage value in a first period, and a second voltage value in a second period after the first period. The second voltage value has the same polarity as the first voltage value but an absolute magnitude smaller than an absolute magnitude of the first voltage value.

Memory devices according to certain example embodiments will be described with reference to FIGS. 1 to 18.

Hereinafter, example embodiments will be described with reference to the drawings. In the following description, components having substantially the same functions and configurations are denoted by the same reference symbols.

In addition, when it is necessary to distinguish different instances of components (for example, circuits, wirings, various voltages, and/or signals, and the like) denoted by the same reference symbols, then suffixes of numerals/letters may be appended to the base reference symbol for distinguishing between the different instances of otherwise substantially similar components.

EMBODIMENTS

(1) First Embodiment

A memory device according to a first embodiment will be described with reference to FIGS. 1 to 13.

(a) Configuration Example

A configuration example of a memory device 1 according to the embodiment will be described with reference to FIGS. 1 to 5.

Figure 1:
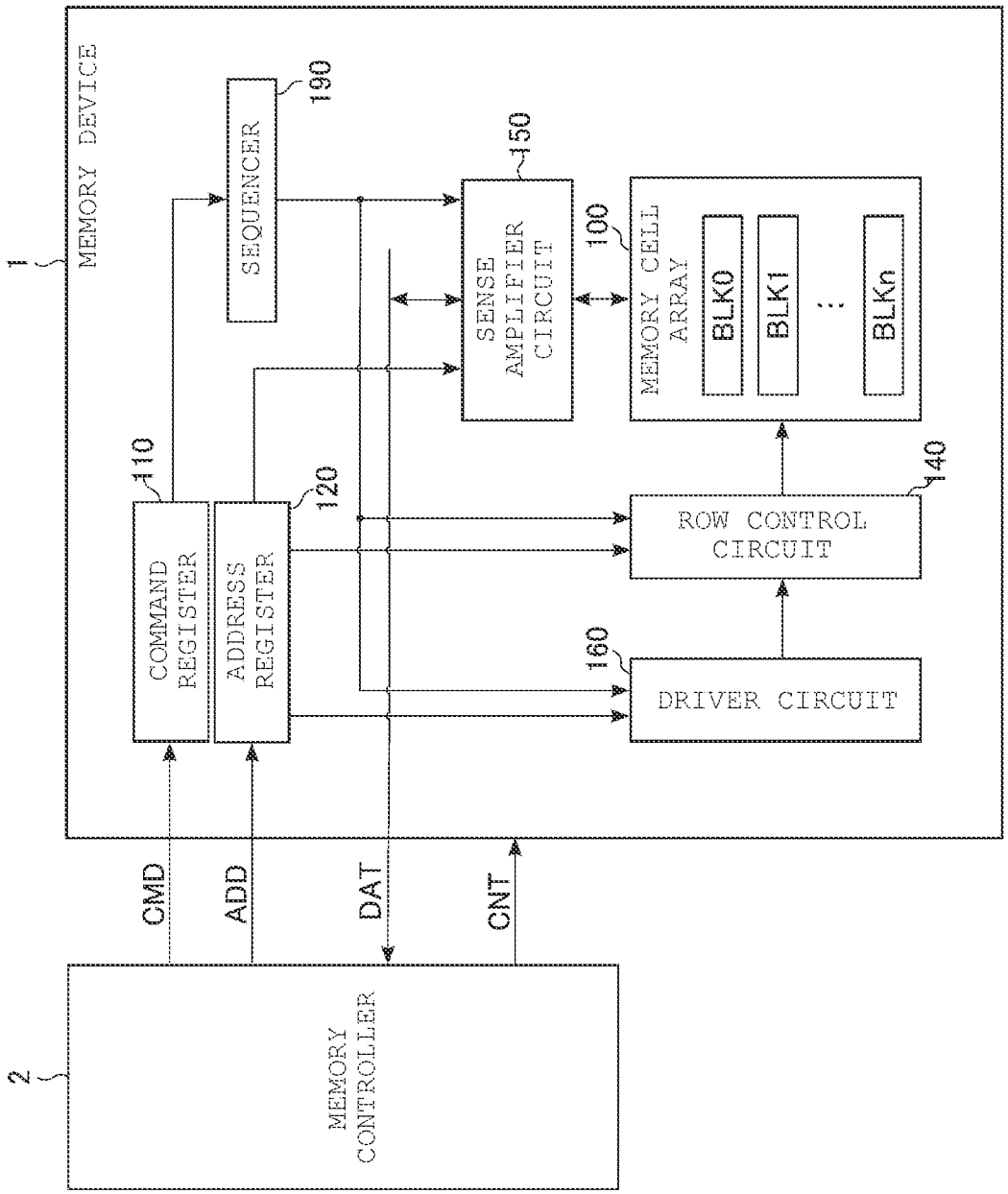
FIG. 1 is a block diagram of a memory device according to a first embodiment.

FIG. 1 is a block diagram illustrating the configuration example of the memory device 1 according to the first embodiment.

As illustrated in FIG. 1, the memory device 1 is electrically coupled to a memory controller 2.

The memory controller 2 transmits a command CMD, an address ADD, and various control signals CNT to the memory device 1.

The memory device 1 receives the command CMD, the address ADD, and the various control signals CNT. Data DAT is transferred between the memory device 1 and the memory controller 2. In the following, the data DAT transferred from the memory controller 2 to the memory device 1 during a write sequence is referred to as write data. Write data DAT is written to the memory device 1. The data DAT transferred from the memory device 1 to the memory controller 2 during a read sequence is referred to as read data. Read data DAT is read from the memory device 1.

The memory device 1 includes a memory cell array 100, a command register 110, an address register 120, a row control circuit 140, a sense amplifier circuit 150, a driver circuit 160, and a sequencer 190.

The memory cell array 100 stores data. A plurality of bit lines (BL) and a plurality of word lines (WL) are provided in the memory cell array 100. The memory cell array 100 includes a plurality of blocks BLK0 to BLKn (where n is an integer of 1 or more). A block BLK is a set (group) of a plurality of memory cells. Each memory cell is associated with one bit line and one word line. The configuration of the memory cell array 100 will be described later.

The command register 110 stores the command CMD from the memory controller 2. The command CMD can be, for example, instructions causing the sequencer 190 to execute the read sequence, the write sequence, an erase sequence, and the like.

The address register 120 stores the address ADD from the memory controller 2. The address ADD includes, for example, a block address, a page address (word line address), and a column address. For example, the block address, the page address, and the column address are used to select the block BLK, the word line, and the bit line, respectively. In the following, a block selected based on the block address is referred to as a selected block. The word line selected based on the page address is referred to as a selected word line.

The row control circuit 140 controls operations related to rows of the memory cell array 100. The row control circuit 140 selects one block BLK in the memory cell array 100 based on the block address in the address register 120. The row control circuit 140, for example, transfers a voltage applied to a wiring corresponding to the selected word line to the selected word line in the selected block BLK.

The sense amplifier circuit 150 controls operations related to columns of the memory cell array 100. The sense amplifier circuit 150 applies a voltage to each of the bit lines provided in the memory cell array 100 according to the write data DAT from the memory controller 2 in the write sequence. The sense amplifier circuit 150 determines the data stored in a memory cell based on a potential (or the presence or absence of current generation) of the bit line in the read sequence. The sense amplifier circuit 150 transfers the data based on the determination result to the memory controller 2 as the read data.

The driver circuit 160 supplies voltages used in the read sequence, the write sequence, the erase sequence, and the like to the memory cell array 100. The driver circuit 160 applies predetermined voltages to, for example, the wiring corresponding to the word line, the wiring corresponding to the bit line, and the like based on the addresses in the address register 120.

The driver circuit 160 functions as a read circuit (also referred to as a read driver), a write circuit (also referred to as a write driver), and an erase circuit (also referred to as an erase driver) in each operation sequence to be executed.

The sequencer 190 controls the entire operations of the memory device 1. For example, the sequencer 190 controls each circuit based on the command CMD in the command register 110.

For example, communication between the memory device 1 and the memory controller 2 is supported by a NAND interface standard.

It is noted that the memory device 1 may further include an input/output circuit, a voltage generation circuit, and the like. The input/output circuit functions as an interface circuit on the memory device 1 side between the memory device 1 and the memory controller 2. The voltage generation circuit generates a plurality of voltages for various operations of the memory device 1.

Memory Cell Array

Figure 2:
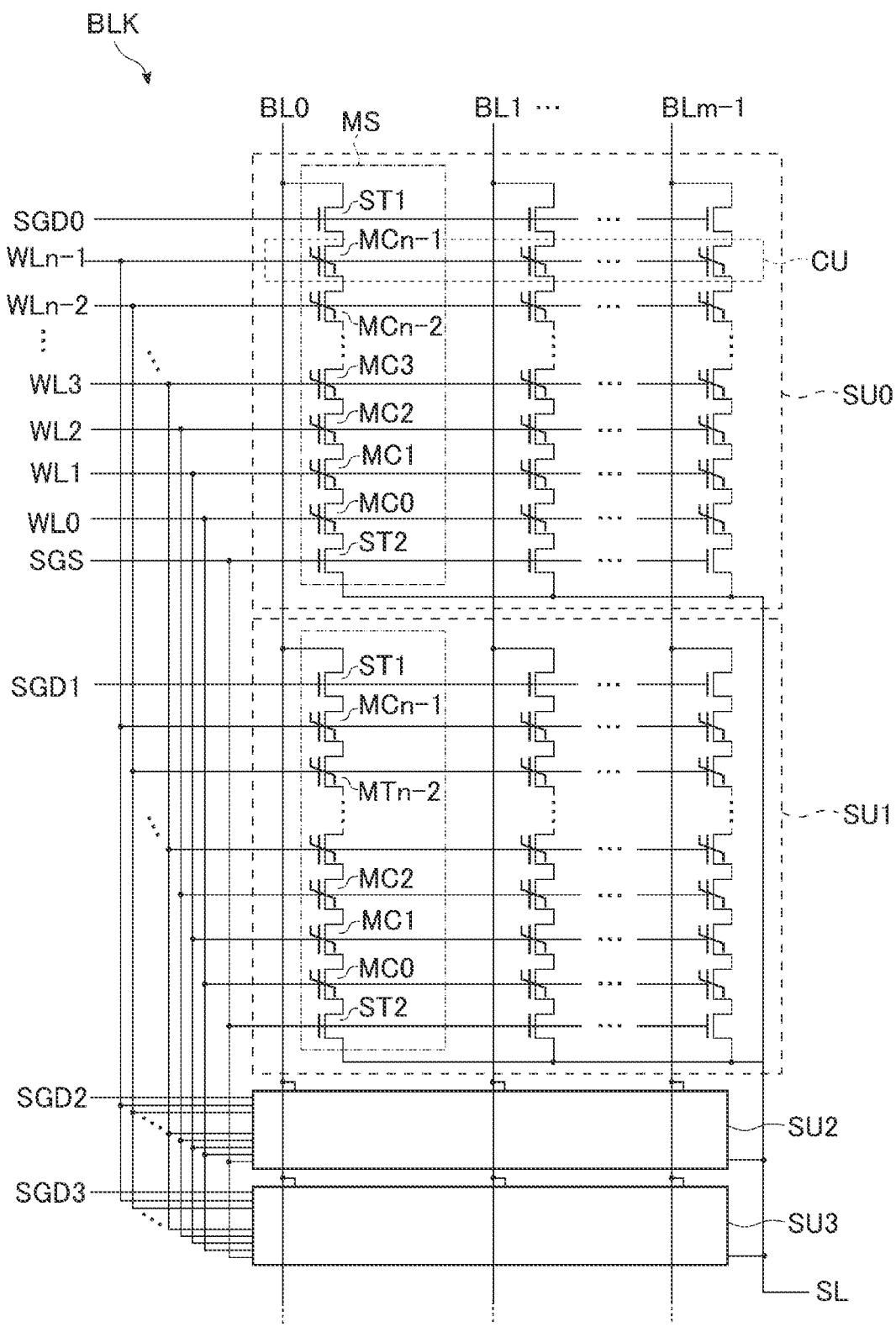
FIG. 2 is a circuit diagram of a memory cell array of a memory device according to a first embodiment.

FIG. 2 is a circuit diagram illustrating a configuration example of the memory cell array 100 of the memory device 1 according to the embodiment.

In FIG. 2, one block BLK of the plurality of the blocks BLK in the memory cell array 100 is illustrated.

As illustrated in FIG. 2, the block BLK includes four string units SU0, SU1, SU2, and SU3. Each of string units SU (SU0, SU1, SU2, and SU3) includes a plurality of memory cell strings MS. Each of the plurality of memory cell strings MS is connected to corresponding one among a plurality of bit lines BL (BL0, BL1, ... BLm–1, m is an integer of 1 or more).

Each of the memory cell strings MS includes a plurality of memory cells MC (MC0, MC1, MCn–1, n is an integer of 1 or more) and select transistors ST1 and ST2.

For example, a total of n memory cells MC (MC0, MC1, MC2, MC3, MCn–2, and MCn–1) are provided in each memory cell string MS.

The memory cell MC can store data of 1 bit or more in a substantially non-volatile manner.

Each of the select transistors ST1 and ST2 is used for selecting particular string unit(s) SU during various operations. For example, each select transistor ST1 may comprise one or more transistors. For example, each select transistor ST2 may comprise one or more transistors.

In each memory cell string MS, the plurality of memory cells MC are connected in series between the source of the select transistor ST1 and the drain of the select transistor ST2. The gate of each of the memory cells MC0, MC1, MC2, MC3, MCn–2, and MCn–1 within the same block BLK is connected to corresponding one among the plurality of word lines WL0, WL1, WL2, WL3, WLn–2, and WLn–1.

In each memory cell string MS, one terminal (the drain in this example) of the select transistor ST1 is connected to corresponding one among the plurality of bit lines BL0, BL1, and BLm–1.

The other terminal (the source in this example) of the select transistor ST1 is connected to one end of the memory cells MC0, ... and MCn–1 connected in series.

Each of gates of the select transistors ST1 is connected to corresponding one among a plurality of select gate lines SGD.

The gate of the select transistor ST1 in the string unit SU0 is connected to a select gate line SGD0. The gate of the select transistor ST1 in the string unit SU1 is connected to a select gate line SGD1. The gate of the select transistor ST1 in the string unit SU2 is connected to a select gate line SGD2. The gate of the select transistor ST1 in the string unit SU3 is connected to a select gate line SGD3.

One terminal (the drain in this example) of the select transistor ST2 is connected to the other end of the memory cells MC0, ... and MCn–1 connected in series. The other terminal (the source in this example) of the select transistor ST2 is connected to a source line SL. The sources of a plurality of the select transistors ST2 in the same block BLK are connected in common to the source line SL.

For example, the gates of the plurality of the select transistors ST2 are connected in common to one select gate line SGS. However, in some examples, a plurality of the select gate lines SGS may be provided independently for each string unit SU.

In the circuit configuration of the memory cell array 100 described above, the drains of the select transistors ST1 corresponding to the same column among the plurality of the blocks BLK are connected to the same bit line BL. The source line SL is, for example, connected in common to a plurality of the blocks BLK.

The drains of the select transistors ST1 corresponding to the same column among a plurality of the string units SU are connected to the same bit line BL.

The plurality of memory cells MC connected to a common word line WL in one string unit SU are referred to as a cell unit CU.

For example, when each memory cell MC stores 1-bit data, one cell unit CU can store data for one page. When each memory cell MC stores 2-bit data, one cell unit CU can store data for two pages.

In the present embodiment, the memory cell MC is a ferroelectric transistor (FeFET: ferroelectric field effect transistor). A threshold voltage of the ferroelectric transistor changes according to an orientation of a spontaneous polarization of a ferroelectric layer of the ferroelectric transistor.

The memory device 1 according to the first embodiment stores data by associating data values with the threshold voltage of a ferroelectric transistor MC which changes in accordance with the orientation of the spontaneous polarization.

A memory cell MC may also be referred to as a ferroelectric transistor MC.

A memory device using a ferroelectric transistor as the memory cell MC is also referred to as a ferroelectric memory.

Figure 3:
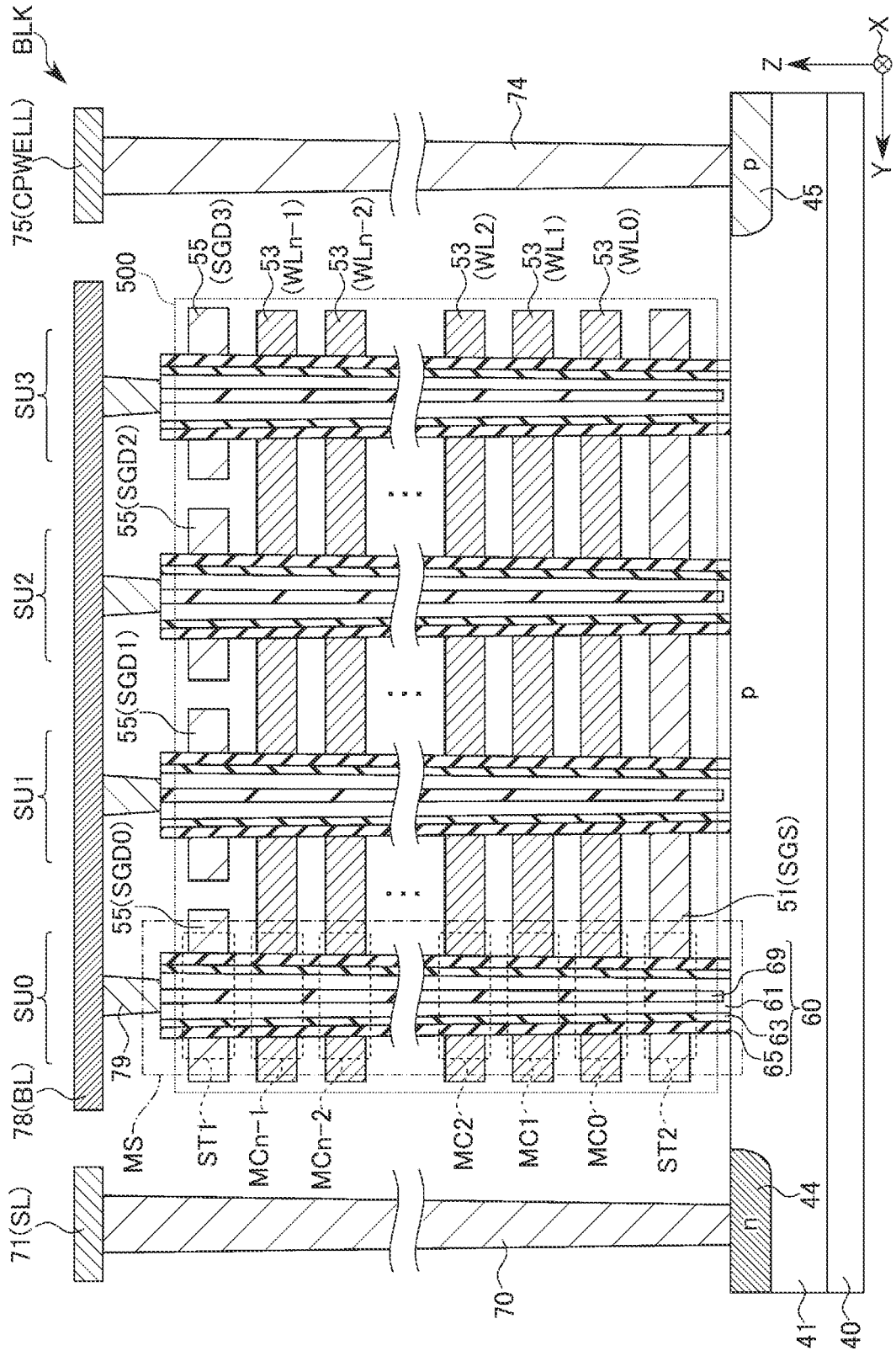
FIG. 3 is a cross-sectional view of a memory cell array of a memory device according to a first embodiment.

FIG. 3 is a cross-sectional view illustrating a structural example of the memory cell array 100 of the memory device 1 according to the first embodiment.

In FIG. 3, an insulating layer (also referred to as an interlayer insulating film) covering an upper surface of a substrate is omitted for clarity of illustration.

As illustrated in FIG. 3, the memory cells MC are two-dimensionally arranged on an upper surface (X-Y plane) of a substrate 40. The memory cells MC are also stacked in a direction (Z direction) perpendicular to the upper surface of the substrate 40.

Thus, the memory device 1 has a memory cell array 100 with a three-dimensional structure.

For example, the substrate 40 is a semiconductor substrate (for example, a silicon substrate).

The substrate 40 includes a semiconductor layer 41. The semiconductor layer 41 contains dopants (impurities) in accordance with a conductivity type to be imparted. For example, the semiconductor layer 41 is a p-type semiconductor layer. The semiconductor layer contains a predetermined concentration of p-type dopants (for example, boron).

The semiconductor layer 41 is, for example, a well region provided in the semiconductor substrate 40.

A plurality of the semiconductor regions 44 and 45 are provided in the semiconductor layer 41. Each of the semiconductor regions 44 and 45 contains n-type or p-type dopants (impurities) in accordance with the conductivity type to be imparted.

For example, the semiconductor region 44 is an n-type semiconductor region (diffusion layer). The n-type semiconductor region 44 contains a predetermined concentration of n-type dopants (for example, phosphorus or arsenic).

The semiconductor region 44 is connected to a wiring 71 (for example, a metal layer) via a contact plug 70. The contact plug 70 is provided on the semiconductor region 44. The contact plug 70 extends in the Z direction. The wiring 71 is provided above the semiconductor layer 41 in the Z direction. The wiring 71 functions as the source line SL.

For example, the semiconductor region 45 is a p-type semiconductor region (diffusion layer). The p-type semiconductor region 45 contains a predetermined concentration of p-type dopants.

The semiconductor region 45 is connected to a wiring 75 (for example, a metal layer) via a contact plug 74. The contact plug 74 is provided on the semiconductor region 45. The contact plug 74 extends in the Z direction. The wiring 75 is provided above the semiconductor layer 41 in the Z direction. The wiring 75 functions as a well wiring CPWELL. The potential of the semiconductor layer 41 can be controlled by applying a voltage to the semiconductor layer 41 via the wiring 75.

A plurality of conductive layers 51, 53, and 55 are stacked on the semiconductor layer 41 in the Z direction. An insulating layer is provided between the conductive layers 53 and 55 adjacent to each other in the Z direction.

The conductive layer 51 is disposed above the substrate 40 in the Z direction. The conductive layer 51 has a plate-shaped structure extending in the X-Y plane. The conductive layer 51 functions as a source-side select gate line SGS. The conductive layer 51 is shared by, for example, the plurality of the string units SU (SU0, SU1, SU2, and SU3).

A plurality of the conductive layers 55 are above the conductive layers 53 in the Z direction. Each of the individual conductive layers 55 extends in the X direction. Each of the conductive layers 55 functions as a drain-side select gate line SGD (SGD0, SGD1, SGD2, and SGD3). The conductive layers 55 are isolated from each other. For example, each string unit SU (SU0, SU1, SU2, and SU3) has a corresponding conductive layer 55.

A plurality of the conductive layers 53 are stacked above the substrate 40 in the Z direction. The plurality of the conductive layers 53 are located in the Z direction in the space between the conductive layer 51 and the conductive layers 55 in the Z direction. Each of the conductive layers 53 has, for example, a plate-shaped structure extending in the X-Y plane. Each of the conductive layers 53 functions as a word line WL. The conductive layer 53 spans the plurality of the string units SU in the block BLK.

A plurality of pillars 60 are provided in a stacked body 500. The stacked body 500 includes the conductive layers 51, 53, and 55 (and the insulating layers therebetween). Each of the pillars 60 extends in the Z direction. The pillar 60 penetrates through the plurality of conductive layers 51, 53, and 55. The side surfaces (surfaces along the Z direction) of the pillar 60 face the conductive layers 51, 53, and 55.

The lower end (bottom) of the pillar 60 in the Z direction is in contact with the semiconductor layer 41. The upper end (top) of the pillar 60 in the Z direction is connected to a wiring 78 (for example, a metal layer) via a contact plug 79. The wiring 78 extends in the Y direction. The wiring 78 functions as the bit line BL. In this example, the pillars 60 aligned with each other in the Y direction are connected to the same wiring 78 (bit line).

The pillar 60 includes a semiconductor layer 61, an insulating layer 63, a ferroelectric layer 65, and a core layer 69. The pillar 60 including the ferroelectric layer 65 is referred to as a memory pillar.

The core layer 69 has a columnar structure extending in the Z direction. For example, the upper end of the core layer 69 is disposed in the region between the region where the wiring 78 of the uppermost layer is provided and the region where the conductive layer 55 is provided. A lower end of the core layer 69 is in contact with the semiconductor layer 61. The core layer 69 can be an insulator such as silicon dioxide ($SiO_2$).

The semiconductor layer 61 is provided between the core layer 69 and the insulating layer 63 and between the core layer 69 and the semiconductor layer 41. The lower end of the semiconductor layer 61 is provided between the lower end of the core layer 69 and the upper surface of the semiconductor layer 41. The semiconductor layer 61 has a portion in direct contact with the semiconductor layer 41. Therefore, the semiconductor layer 61 is electrically connected to the semiconductor layer 41. For example, the semiconductor layer 61 covers the lower end of the core layer 69. The semiconductor layer 61 has a cylindrical (or elliptic cylindrical) structure. The semiconductor layer 61 is, for example, a layer comprising silicon (for example, a polysilicon layer or an amorphous silicon layer).

The insulating layer 63 is provided between the ferroelectric layer 65 and the semiconductor layer 61. The insulating layer 63 covers side surfaces (surfaces along the Z direction) of the semiconductor layer 61. The insulating layer 63 is, for example, a layer comprising silicon oxide.

The ferroelectric layer 65 is provided between the conductive layers 51, 53, and 55 and the insulating layer 63. The side surfaces (surfaces along the Z direction) of the ferroelectric layer 65 face the conductive layers 51, 53, and 55.

The ferroelectric layer 65 is, for example, a layer comprising hafnium oxide. In some examples, a hafnium oxide layer comprising at least one of silicon, aluminum, barium, zirconium, gadolinium, lanthanum, strontium, and yttrium may be used for the ferroelectric layer 65.

The ferroelectric layer 65 has spontaneous polarization characteristics.

Each of the portions of the ferroelectric layer 65 at the intersections of the conductive layers 53 and the memory pillar 60 functions as the memory cell MC (or a ferroelectric transistor).

The portion of memory pillar 60 at the intersection of the conductive layer 51 functions as the select transistor ST2.

The portion of memory pillar 60 at the intersection of the conductive layer 55 functions as the select transistor ST1.

Figure 4:
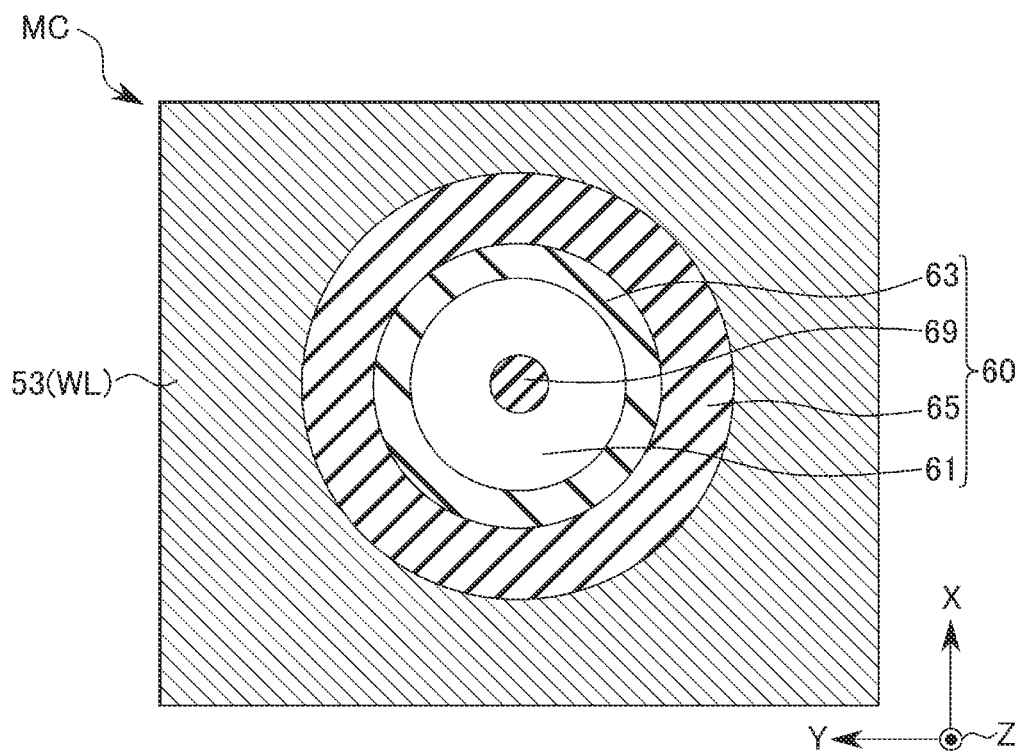
FIG. 4 is a top view of a memory cell of a memory device according to a first embodiment.
Figure 5:
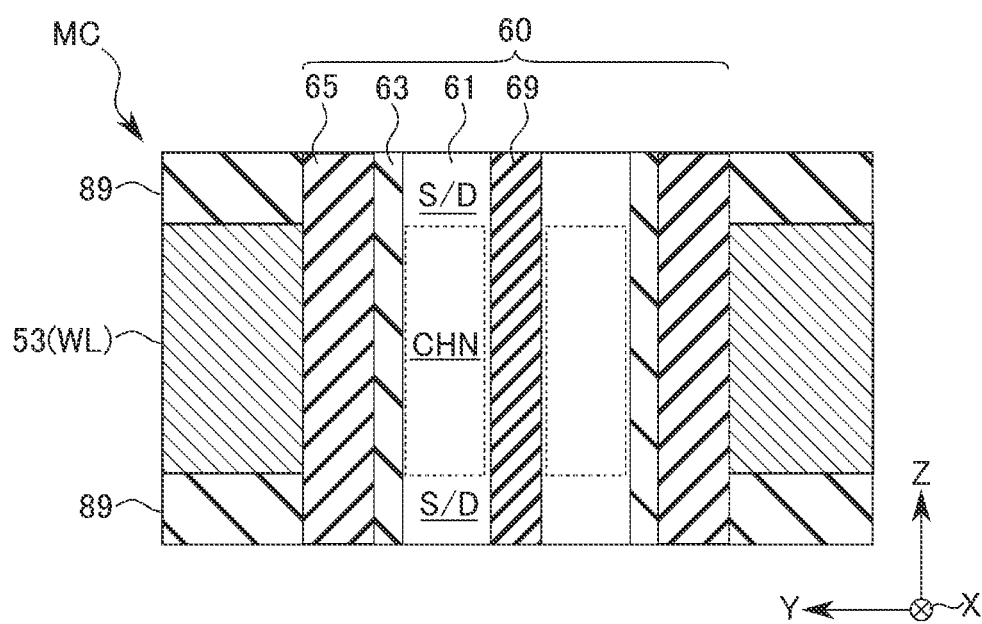
FIG. 5 is a cross-sectional view of a memory cell of a memory device according to a first embodiment.

FIGS. 4 and 5 are diagrams illustrating a structural example of the memory cell MC in the memory device 1 according to the embodiment. FIG. 4 is a top view illustrating a planar structure of the memory cell MC. FIG. 5 is a cross-sectional view illustrating a cross-sectional structure of the memory cell MC.

As illustrated in FIGS. 4 and 5, the memory pillar 60 has a cylindrical columnar structure.

The core layer 69 has a cylindrical columnar structure extending in the Z direction.

The semiconductor layer 61 has a cylindrical structure extending in the Z direction.

The insulating layer 63 is provided between the conductive layer 53 and the semiconductor layer 61. The insulating layer 63 has a cylindrical structure. The cylindrical insulating layer 63 covers the side surface (surface along the Z direction) of the semiconductor layer 61.

The ferroelectric layer 65 is provided between the conductive layer 53 and the insulating layer 63. The ferroelectric layer 65 has a cylindrical structure. The cylindrical ferroelectric layer 65 covers the side surface of the semiconductor layer 61 via the insulating layer 63.

As described above, the memory cell MC is a ferroelectric transistor in this example.

A stacked film including the insulating layer 63 and the ferroelectric layer 65 functions as a gate insulating film of the ferroelectric transistor MC. However, in other explanations, only the insulating layer 63 may be considered to function as a gate insulating film, and the ferroelectric layer 65 may be considered to function as a memory layer. The insulating layer 63 may be a stacked film including a plurality of layers made of different materials, or may be a single layer film made of one material. The insulating layer 63 is also referred to as an interface layer.

The conductive layer 53 functions as a word line WL of the ferroelectric memory device 1 and also as a gate electrode of the ferroelectric transistor MC. The conductive layers 53 are provided between the insulating layers 89 in the Z direction.

The conductive layer 53 is, for example, a stacked film including a metal layer (for example, a tungsten layer) and a conductive compound layer (for example, a titanium nitride layer). The conductive compound layers are provided between the metal layer and the insulating layer 89 and between the metal layer and the ferroelectric layer 65.

A channel region CHN of the ferroelectric transistor MC is provided in the semiconductor layer 61. The channel region CHN of the ferroelectric transistor MC faces the conductive layer 53 via the ferroelectric layer 65 and the insulating layer 63. The two source/drain regions (S/D) of the ferroelectric transistor MC are aligned in the Z direction via the channel region CHN.

Thus, the ferroelectric transistor MC is a vertical type transistor. Therefore, a current path of the ferroelectric transistor MC as the memory cell runs along the Z direction.

The select transistors ST (ST1 and ST2) have substantially the same structure as the ferroelectric transistor MC. However, in other examples, the structure of the select transistor ST may be different from the structure of the ferroelectric transistor MC. For example, the select transistor ST may have a structure without the ferroelectric layer 65 (memory layer) included therein.

It is noted that the memory cell array 100 having the structure illustrated in FIG. 3 can be formed by a well-known manufacturing method.

In the memory device 1 according to the embodiment, the ferroelectric transistors MC are used as the memory cells MC due to the polarization characteristics of the ferroelectric transistor.

Principle of Operation of Memory Cell

The principle of the operation of the ferroelectric transistor MC as the memory cell will be described with reference to FIGS. 6 to 8.

FIGS. 6 and 7A, 7B, 7C are schematic diagrams illustrating the characteristics of the ferroelectric transistor MC as a memory cell.

Figure 6:
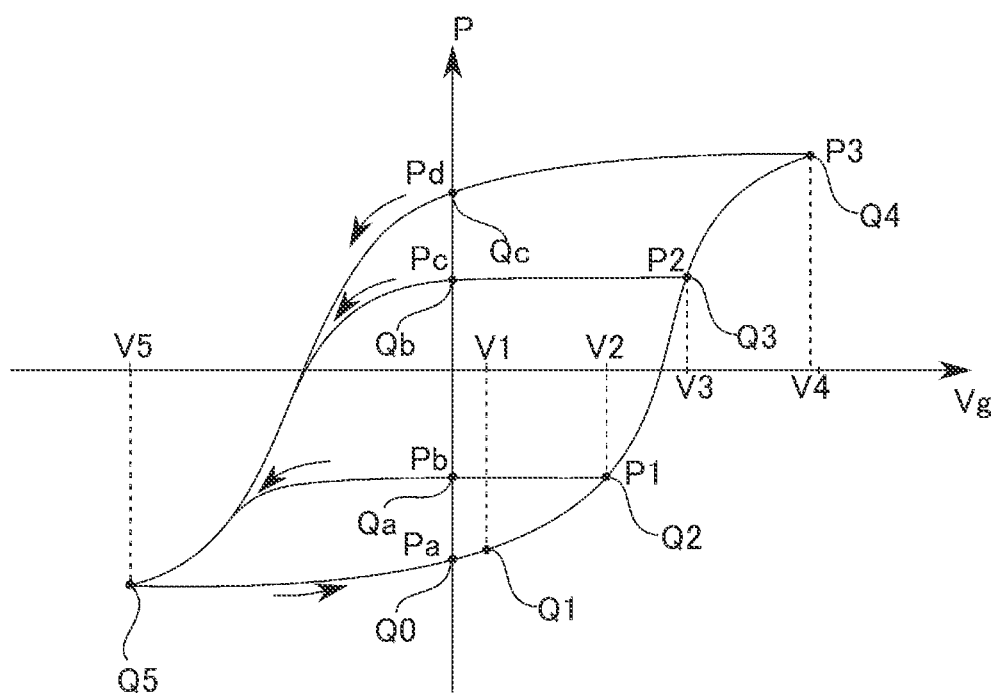
FIG. 6 is a diagram related to a principle of an operation of a memory device according to a first embodiment.

FIG. 6 is a graph illustrating the polarization characteristics of the ferroelectric transistor MC. The horizontal axis of the graph in FIG. 6 indicates a gate-source voltage Vg of the ferroelectric transistor MC. The vertical axis of the graph in FIG. 6 indicates a spontaneous polarizability P of the ferroelectric layer 65 of the ferroelectric transistor MC.

FIGS. 7A to 7C are diagrams schematically illustrating the state of the ferroelectric transistor MC in accordance with the state of the spontaneous polarization of the ferroelectric layer 65.

As illustrated in FIG. 6, the ferroelectric layer 65 has characteristics indicated by a hysteresis curve in the relationship between the voltage Vg and the spontaneous polarizability P.

When the voltage Vg is applied to a gate (word line) of the ferroelectric transistor MC, an electric field is generated in the ferroelectric layer 65. Due to the influence of the generated electric field, the positions of the ions located in a crystal lattice in the ferroelectric layer 65 are changed. Accordingly, the polarization is generated in the ferroelectric layer 65.

The spontaneous polarizability P (also referred to as a polarization amount) indicates a degree of the spontaneous polarization of the ferroelectric layer 65. The spontaneous polarizability P depends on the amount of charges derived from the spontaneous polarization in the amount of surface charges per unit area generated in the ferroelectric layer 65 in a boundary region between the ferroelectric layer 65 and another layer (the insulating layer 63 in this example) in contact with the ferroelectric layer 65.

For example, when the voltage Vg is 0 V and the spontaneous polarizability P of the ferroelectric layer 65 is a negative value Pa (in a state "Q0" in FIG. 6), as illustrated in FIG. 7A, positive spontaneous polarization charges in a spontaneous polarization plz1 are generated on the conductive layer 53 (gate) side, and negative spontaneous polarization charges are generated on the semiconductor layer 61 (channel region) side. Hereinafter, a state in which the positive spontaneous polarization charges are generated on the conductive layer side is referred to as an up state.

When the voltage Vg applied to the ferroelectric transistor MC is increased from 0 V to a certain positive voltage value "V1" in a state in which the ferroelectric layer 65 has a negative spontaneous polarizability P (in a state "Q1" in FIG. 6), the spontaneous polarization of the ferroelectric layer 65 is hardly reversed. In this case, the magnitude of the spontaneous polarizability P of the ferroelectric layer 65 is hardly changed.

When a voltage value of the voltage Vg is increased from V1 to a positive voltage value "V2" (in a state "Q2" in FIG. 6), as illustrated in FIG. 7B, a direction of a spontaneous polarization plz2 of the ferroelectric layer 65 is partially reversed with respect to the negative spontaneous polarization plz1 (also referred to as a negative spontaneous polarization state). Accordingly, the spontaneous polarizability P of the ferroelectric layer 65 is sharply increased up to a certain value P1.

It is noted that, when the orientation of the spontaneous polarization is reversed, the state in which the orientation of the spontaneous polarization is reversed is maintained even when the voltage value of the voltage Vg is returned from V2 to 0 V. Therefore, even when the voltage Vg is reduced from the voltage value V2 in the state Q2 to 0 V, the spontaneous polarizability P becomes a value Pb higher than the value Pa as in a state Qa.

When the voltage value of the voltage Vg is increased from V2 to a positive voltage value "V3" (in a state "Q3" in FIG. 6), the spontaneous polarization reversal of the ferroelectric layer 65 progresses, and the spontaneous polarizability P is increased from the negative value P1 to a positive value P2.

As described above, the reversed state of the spontaneous polarization is maintained. Therefore, when the voltage value of the voltage Vg is reduced from V3 in the state Q3 to 0 V (in a state "Qb" in FIG. 6), the spontaneous polarization P becomes a value Pc higher than the value Pb.

When the voltage value of the voltage Vg is increased from V3 to a positive voltage value "V4" (in a state "Q4" in FIG. 6), the orientation of the spontaneous polarization plz2 of the ferroelectric layer 65 is almost reversed, as illustrated in FIG. 7C. In this case, the spontaneous polarizability P is increased to a positive value P3, and thus, is in, for example, a saturated state.

When the voltage value of the voltage Vg is reduced from V4 to 0 V, even when the voltage Vg becomes 0 V, the ferroelectric layer 65 has a spontaneous polarizability P of a positive value Pd, and thus, maintains a state Qc having a positive spontaneous polarizability P.

In the spontaneous polarization plz2, the negative spontaneous polarization charges are generated on the conductive layer 53 (gate) side, and the positive spontaneous polarization charges are generated on the semiconductor layer 61 (channel region) side. The state in which the negative spontaneous polarization charges are generated on the conductive layer side is referred to as a down state.

When a voltage Vg having the positive voltage value is applied to the ferroelectric layer 65 having a negative spontaneous polarizability P, the spontaneous polarizability P of the ferroelectric layer 65 is changed from a negative value to a positive value side.

When the ferroelectric layer 65 has the positive spontaneous polarizability P, the ferroelectric layer 65 is in a state in which a positive voltage having a magnitude in accordance with the positive spontaneous polarizability P is applied between the gate (conductive layer 53) and the channel region (semiconductor layer 61) of the ferroelectric transistor MC.

As a result, the value of the threshold voltage of the ferroelectric transistor MC when the ferroelectric layer 65 has the positive spontaneous polarizability P is reduced in comparison with the value of the threshold voltage of the ferroelectric transistor MC when the ferroelectric layer 65 has the negative spontaneous polarizability P.

When the voltage value of the voltage Vg is reduced from 0 V to a negative voltage value "V5" (in a state "Q5" in FIG. 6), the orientation of the spontaneous polarization of the ferroelectric layer 65 is reversed from the positive polarization direction to the negative polarization direction.

Accordingly, the spontaneous polarizability P of the ferroelectric layer 65 of the ferroelectric transistor MC is changed from the positive value to the negative value. At this time, the spontaneous polarizability P of the ferroelectric layer 65 is saturated at the negative value.

Then, due to the application of the voltage Vg with a negative polarity to the ferroelectric transistor MC, the spontaneous polarizability P of the ferroelectric layer 65 is changed from the positive value to the negative value.

When the voltage value of the voltage Vg is increased from V5 to 0 V after the spontaneous polarizability P of the ferroelectric layer 65 is changed from the positive value to the negative value, the spontaneous polarizability P of the ferroelectric layer 65 having the negative value (for example, polarizability Pa) is maintained.

As described above, the threshold voltage of the ferroelectric transistor MC is changed according to changes in the spontaneous polarizability P of the ferroelectric layer 65. The changed magnitude of the threshold voltage is maintained until a voltage having a voltage value for changing the direction of the spontaneous polarization of the ferroelectric layer 65 is applied.

When the ferroelectric transistor is used as the memory cell MC, data to be stored can be associated with a plurality of the possible threshold voltages of the ferroelectric transistor MC that can be changed according to the spontaneous polarizability P.

Therefore, the ferroelectric transistor MC can be applied to the memory device 1 as a memory cell MC storing data in a non-volatile manner.

Relationship Between Threshold Voltage and Data

Figure 8A:
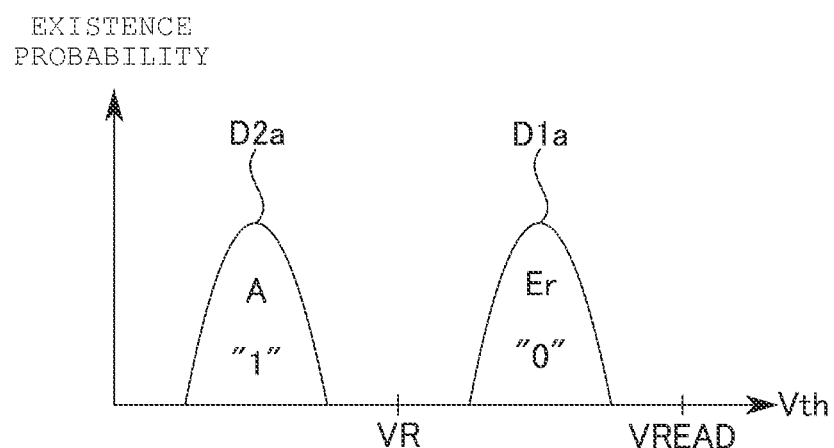
FIGS. 8A and 8B are diagrams illustrating aspects related to an operation of a memory device according to a first embodiment.
Figure 8B:
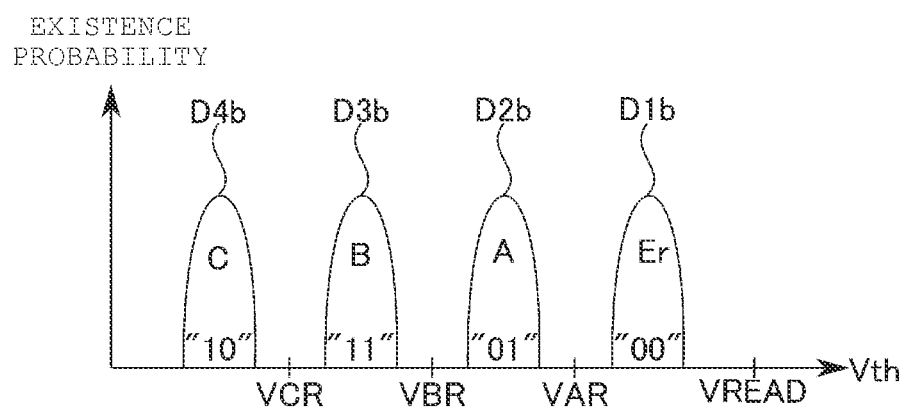

FIGS. 8A and 8B are diagrams illustrating a relationship between the threshold voltage of the ferroelectric transistor MC and data (data values). In each of FIGS. 8A and 8B, the horizontal axis of a graph corresponds to a threshold voltage Vth of the ferroelectric transistor MC, and the vertical axis of the graph corresponds to an existence probability of a ferroelectric transistor MC having the particular threshold voltage Vth.

FIG. 8A is the graph illustrating a relationship between "0" and "1" data and the threshold voltage Vth of the ferroelectric transistor MC when the ferroelectric transistor MC stores 1-bit data. The memory cell MC (the ferroelectric transistor) storing 1-bit data is referred to as a single-level cell (SLC).

In the case of FIG. 8A, the state (data storing state) of the ferroelectric transistor MC having a threshold voltage having a voltage value higher than a certain voltage level VR is referred to as an erased state (or "Er state"). The state of the ferroelectric transistor MC having a threshold voltage having a voltage value lower than the certain voltage level VR is referred to as a programmed state (or "A state").

For example, the erased state of the ferroelectric transistor MC corresponds to a state in which the spontaneous polarizability P of the ferroelectric layer 65 of the ferroelectric transistor MC has a negative value (for example, the state "Q0" in FIG. 6). The programmed state of the ferroelectric transistor MC corresponds to a state in which the spontaneous polarizability P of the ferroelectric layer 65 of the ferroelectric transistor MC has a positive value (for example, the state "Qc" in FIG. 6).

In this case, a threshold voltage distribution D1a in the Er state corresponds to the group of ferroelectric transistors MC with the ferroelectric layer 65 having the spontaneous polarizability Pa in FIG. 6. A threshold voltage distribution D2a in the A state corresponds to the group of ferroelectric transistors MC with the ferroelectric layer 65 having the spontaneous polarizability Pd in FIG. 6.

For example, "0" data is associated with the ferroelectric transistor MC in the Er state belonging to the threshold voltage distribution D1a. And "1" data is associated with the ferroelectric transistor MC in the A state belonging to the threshold voltage distribution D2a.

As described above, when the gate-source voltage Vg of a negative voltage value (for example, the voltage V5) is applied to the memory cell MC, the ferroelectric transistor MC is set to the erased state.

When the gate-source voltage Vg of a positive voltage value (for example, the voltage V4) is applied to the memory cell MC, the ferroelectric transistor MC is set to the programmed state.

A voltage pulse for setting the data storing state of the ferroelectric transistor MC to the erased state is referred to as an erase pulse. The erase pulse has a negative voltage value.

A voltage pulse for setting the data storing state of the ferroelectric transistor MC to the programmed state is referred to as a write pulse (or program pulse). The write pulse has a positive voltage value.

The voltage value (for example, the voltage level VR in FIG. 8A) between the adjacent threshold voltage distributions D1a and D2a is used for distinguishing between different threshold voltage distributions and is referred to as a read level or a read voltage level.

A read pulse including one or more read levels VR is applied to the gate of the ferroelectric transistor MC for reading the data stored in the ferroelectric transistor MC.

When the ferroelectric transistor MC is turned on by the application of the read level VR, the ferroelectric transistor MC has a threshold voltage that is equal to or lower than the read level VR. When the ferroelectric transistor MC is turned off (or remains off) by the application of the read level VR, the ferroelectric transistor MC has a threshold voltage that is higher than the read level VR.

The data stored in the ferroelectric transistor MC is read by the detection of a signal in accordance with the on/off state of the ferroelectric transistors MC.

A voltage level VREAD (referred to as a read pass voltage) is provided at a voltage level higher than the threshold voltage distribution D1a for the erased state. Due to the application of the voltage level VREAD to the ferroelectric transistor MC, the ferroelectric transistors MC are turned on regardless of the data stored in the ferroelectric transistor MC.

FIG. 8B is the graph illustrating a relationship between data "00", "01", "10", and "11" and the threshold voltage of the ferroelectric transistors MC when 2-bit data is stored. A memory cell MC storing the 2-bit data is referred to as a multi-level cell (MLC).

In the case of FIG. 8B, the ferroelectric transistor MC storing the 2-bit data can have one of four states: one erased state (Er state) and three programmed states (A state, B state, and C state) according to the data value to be stored.

For example, a threshold voltage distribution D1b in the Er state corresponds to the group of ferroelectric transistors MC with the ferroelectric layer 65 having the spontaneous polarizability Pa in FIG. 6. A threshold voltage distribution D2b in the A state corresponds to the group of ferroelectric transistors MC with the ferroelectric layer 65 having the spontaneous polarizability Pb in FIG. 6. A threshold voltage distribution D3b in the B state corresponds to the group of ferroelectric transistors MC with the ferroelectric layer 65 having the spontaneous polarizability Pc in FIG. 6. A threshold voltage distribution D4b in the C state corresponds to the group of ferroelectric transistors MC with the ferroelectric layer 65 having the spontaneous polarizability Pd in FIG. 6.

For example, the "00" data is associated with threshold voltage distribution D1b ("Er state" distribution). The "10" data is associated with the lowest threshold voltage distribution D4b ("C state" distribution). The "01" data is associated with the threshold voltage distribution D2b ("A state" distribution). The "11" data is associated with the threshold voltage distribution D3b ("B state" distribution).

Read levels VAR, VBR, and VCR are between adjacent threshold voltage distributions.

By applying the read level VAR, it can be determined whether the threshold voltage of the ferroelectric transistor MC is a value belonging to the erased state (Er state) or a value belonging to the programmed state (A state, B state, and C state).

By applying the read level VCR, it can be determined whether the threshold voltage is a value belonging to the C state or a value belonging to the B state, the A state, or the Er state.

By applying the read level VBR, it can be determined whether the threshold voltage is a value belonging to the A state or the Er state or a value belonging to the B state or the C state.

For example, by applying the read levels VAR and VCR, the lower bit data of the 2-bit data can be read. For example, by applying the read level VBR, the higher bit data of the 2-bit data can be read.

In this manner, a ferroelectric transistor design can be applied to the memory device 1 as the memory cell MC. Accordingly, a ferroelectric memory is provided.

(b) Operation Example

An operation example of a memory device (ferroelectric memory device) according to the first embodiment will be described with reference to FIGS. 9 to 12.

A memory cell MC (ferroelectric transistor) that is an operation target is referred to as a selected cell in the following. A memory cell string including a selected cell is referred to as a selected string. A string unit including a selected string is referred to as a selected string unit. A block including a selected string unit is referred to as a selected block.

The memory cells other than a selected cell are referred to as non-selected cells. The memory cell strings other than a selected string are referred to as non-selected strings. The string units other than a selected string unit are referred to as non-selected string units. The blocks other than a selected block are referred to as non-selected blocks.

In the following, various operation sequences for a memory cell (an SLC type) storing the 1-bit data are exemplified for the simplification of description.

(b-1) Erase Sequence

An erase sequence of the memory device 1 according to the embodiment will be described with reference to FIG. 9.

Figure 9:
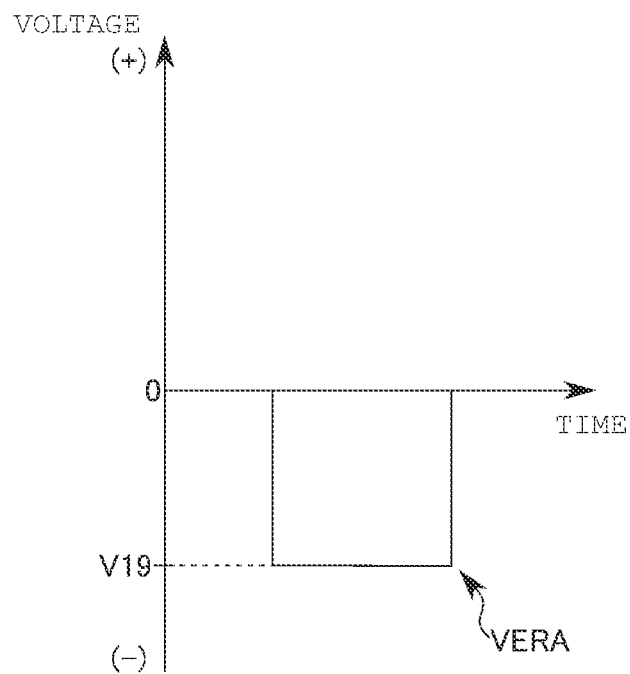
FIG. 9 is a diagram illustrating an erase sequence of a memory device according to a first embodiment.

FIG. 9 is a waveform diagram illustrating the erase pulse (erase voltage) used in the erase sequence of the memory device 1 according to the embodiment. In FIG. 9, the horizontal axis of a graph corresponds to time, and the vertical axis of the graph corresponds to voltage value.

During the execution of the erase sequence, the memory controller 2 transmits an erase command CMD and the address ADD (selected address) to the memory device 1.

The memory device 1 according to the embodiment executes the erase sequence on a region in the memory cell array 100 indicated by the address ADD based on the erase command CMD.

During the erase sequence, the string unit SU and the block BLK including the memory cell MC that is a data erase target are set to a selected state, respectively.

For example, an erasing operation in the erase sequence is executed in units of one block.

During the erase sequence in units of a block, under the control of the sequencer 190, the driver circuit 160 supplies various voltages to the wirings WL, SGS, SGD, BL, and SL in the memory cell array 100, respectively.

The driver circuit 160 applies a voltage having the positive voltage value to each of the select gate lines SGD and SGS. Accordingly, the select transistors ST1 and ST2 are turned on.

After that, the driver circuit 160 supplies an erase pulse VERA (FIG. 9) to the memory cell MC.

As illustrated in FIG. 9, the erase pulse VERA is a voltage with the negative polarity. For example, the erase pulse VERA has a rectangular pulse waveform. The erase pulse VERA has a negative voltage value V19.

The voltage with the negative polarity for the ferroelectric transistor MC, such as the erase pulse VERA, is a voltage in a state in which a potential on the channel region (semiconductor layer 61) side of the ferroelectric transistor MC is higher than a potential on the gate electrode (conductive layer 53) side of the ferroelectric transistor MC.

When the voltage with the negative polarity is applied to the memory cell MC, the driver circuit 160 allows a potential of the memory pillar 60 to be higher than a potential of the word line WL (conductive layer 53).

For example, the driver circuit 160 applies the voltages having the positive voltage values to the bit line BL and the source line SL. In the following, the voltage applied to the bit line BL is referred to as a bit line voltage, and the voltage applied to the source line SL is referred to as a source line voltage.

The driver circuit 160 applies a voltage of 0 V or a voltage with a positive polarity less (lower) than the bit line voltage and the source line voltage to all the word lines WL in the selected block BLK.

Therefore, the erase pulse VERA with the negative polarity is applied to each of the selected cells MC. For example, the erase pulse VERA has a voltage value in accordance with a potential difference between the word line WL and the bit line BL.

For example, the driver circuit 160 controls a pulse width (voltage supply period) of the erase pulse VERA by controlling the supply period of the bit line voltage and the source line voltage.

By supplying the erase pulse VERA, the ferroelectric transistor MC, which is the selected cell, is set to the erased state.

After that, the supplying of the erase pulse VERA is stopped.

The driver circuit 160 applies the voltage of 0 V to the bit line BL and the source line SL. The driver circuit 160 applies the voltage of 0 V to the word line WL.

After the supplying of the erase pulse VERA is stopped, the voltage of 0 V is applied to the select gate lines SGD and SGS. Accordingly, the select transistors ST1 and ST2 are turned off.

As described above, the erase sequence is completed in the memory device 1 according to the embodiment.

In some examples, in the erase sequence of the memory device 1 according to the embodiment, erase verification may be executed after the supplying of the erase pulse VERA. In addition, the erase sequence may be executed in units smaller than a block, for example, in units of a page (units of one word line).

(b-2) Write Sequence

A write sequence of the memory device 1 according to the embodiment will be described with reference to FIG. 10.

Figure 10:
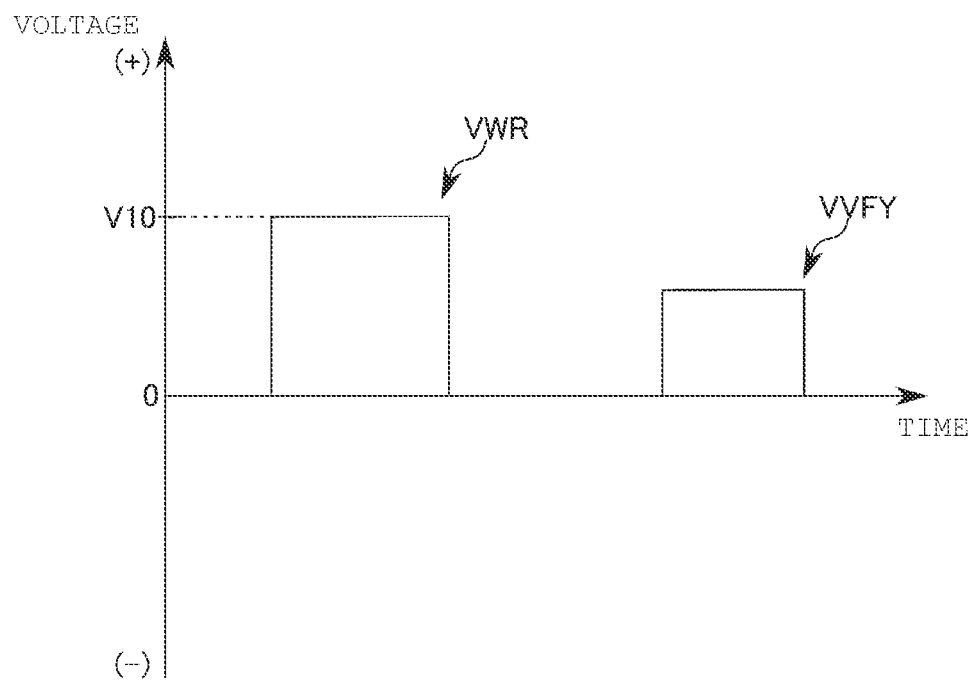
FIG. 10 is a diagram illustrating a write sequence of a memory device according to a first embodiment.

FIG. 10 is a waveform diagram illustrating the write pulse (write voltage) used in the write sequence of the memory device 1 according to the embodiment. In FIG. 10, the horizontal axis of a graph corresponds to time, and the vertical axis of the graph corresponds to voltage value.

During the execution of the write sequence, the memory controller 2 transmits a write command CMD, the address ADD, and the write data DAT to the memory device 1.

The memory device 1 executes the write sequence on a region in the memory cell array 100 indicated by the address ADD based on the write command CMD.

During the write sequence, the string unit SU and the block BLK including the memory cell MC that is a data write target are set to the selected state, respectively.

For example, a program operation in the write sequence is executed in units of a page (a per page basis).

During the write sequence, under the control of the sequencer 190, the driver circuit 160 supplies various voltages to the plurality of the wirings WL, SGD, SGS, BL, and SL in the memory cell array 100, respectively.

The driver circuit 160 applies voltages having a certain voltage value to the bit line BL and the source line SL.

The driver circuit 160 applies the voltage having the positive voltage value to the selected select gate line SGD. Accordingly, the select transistor ST1 connected to the selected select gate line SGD is turned on.

The driver circuit 160 applies a voltage (for example, a ground voltage) having a certain voltage value to a non-selected select gate line SGD. Accordingly, the select transistor ST1 connected to the non-selected select gate line SGD is turned off.

The driver circuit 160 applies the voltage of 0 V or the voltage having the positive voltage value to the select gate line SGS. For example, the select transistor ST2 is turned off.

The driver circuit 160 applies a voltage (referred to as a non-select voltage or a write pass voltage) having the positive voltage value to a plurality of non-selected word lines WL.

The driver circuit 160 executes the program operation in the write sequence.

The driver circuit 160 supplies a write pulse VWR (FIG. 10) to the memory cell MC connected to a selected word line WL.

As illustrated in FIG. 10, the write pulse VWR is a voltage with the positive polarity. For example, the write pulse VWR has a rectangular pulse waveform. The write pulse VWR has a positive voltage value V10.

The voltage with the positive polarity for the ferroelectric transistor MC, such as the write pulse VWR, is a voltage in a state in which the potential on the gate electrode (conductive layer 53) side of the ferroelectric transistor MC is higher than the potential on the channel region (semiconductor layer 61) side of the ferroelectric transistor MC.

When the voltage with the positive polarity is applied to the selected cell MC connected to the selected word line WL, the driver circuit 160 allows the potential of the selected word line WL to be higher than the potential of the memory pillar 60.

For example, the driver circuit 160 applies a bit line voltage of 0 V to the bit line BL. The voltage of 0 V is applied to the memory pillar 60 via the select transistor ST1 in the on state.

The driver circuit 160 applies a voltage having a positive voltage value higher than the bit line voltage to the selected word line WL.

Therefore, the write pulse VWR with the positive polarity is applied to each of the selected cells MC. The write pulse VWR has the voltage value V10 in accordance with the potential difference between the word line WL and the bit line BL.

For example, the driver circuit 160 controls the pulse width (voltage supply period) of the write pulse VWR by controlling the voltage supply period for the word line WL.

After that, the supplying of the write pulse VWR is stopped.

The driver circuit 160 applies the voltage of 0 V to the bit line BL and the source line SL. The driver circuit 160 applies the voltage of 0 V to a plurality of the word lines WL.

After the supplying of the write pulse VWR is stopped, the voltage of 0 V is applied to the selected select gate lines SGD and SGS. Accordingly, the select transistors ST1 and ST2 are turned off.

In some examples, the driver circuit 160 performs a verification operation of the write sequence after the program operation. The magnitude of the threshold voltage of the selected cell MC after the program operation is verified by the verification operation.

As illustrated in FIG. 10, a voltage VVFY (verification pulse VVFY) having a positive voltage value is supplied to the selected cell MC.

The driver circuit 160 applies the voltage having the positive voltage value to the bit line.

The driver circuit 160 applies the voltage having the positive voltage value to the selected select gate lines SGD and SGS. Accordingly, the select transistors ST1 and ST2 are turned on.

During the verification operation, the driver circuit 160 applies the voltage having the positive voltage value to the non-selected word lines WL. Accordingly, the non-selected cells are turned on.

The driver circuit 160 applies the voltage having the positive voltage value to the selected word line WL. Accordingly, the verification pulse VVFY is applied between the gate and the channel of the selected cell MC. For example, the voltage value of the verification pulse VVFY has a value in accordance with a lower limit in each threshold voltage distribution.

During the application of the verification voltage VVFY, the selected cell MC is turned on or off according to whether the threshold voltage of the selected cell MC is higher than the verification pulse VVFY.

When the threshold voltage of the selected cell MC is higher than the verification pulse VVFY, the selected cell MC is turned off.

When the threshold voltage of the selected cell MC is equal to or lower than the verification pulse VVFY, the selected cell MC is turned on.

It can be determined whether the selected cell MC has a threshold voltage in accordance with the intended data to be stored based on the on/off result of the selected cell MC with respect to the application of the verification voltage VVFY.

After that, the supplying of the verification pulse VVFY is stopped.

The driver circuit 160 applies the voltage of 0 V to the bit line BL and the source line SL. The driver circuit 160 applies the voltage of 0 V to the plurality of the word lines WL.

After the supplying of the verification pulse VVFY is stopped, the voltage of 0 V is applied to the select gate lines SGD and SGS. Accordingly, the select transistors ST1 and ST2 are turned off.

It can be determined whether the write pulse VWR is to be applied again based on the result of the verification operation.

For example, the program operation and the verification operation are repeatedly executed until the threshold voltage of the selected cell MC reaches a value in accordance with the data to be stored.

When it is determined that the threshold voltage of the selected cell reaches the value in accordance with the data to be stored by the verification operation, the write sequence is completed.

(b-3) Read Sequence

A read sequence of the memory device 1 according to the embodiment will be described with reference to FIGS. 11 and 12.

Figure 11:
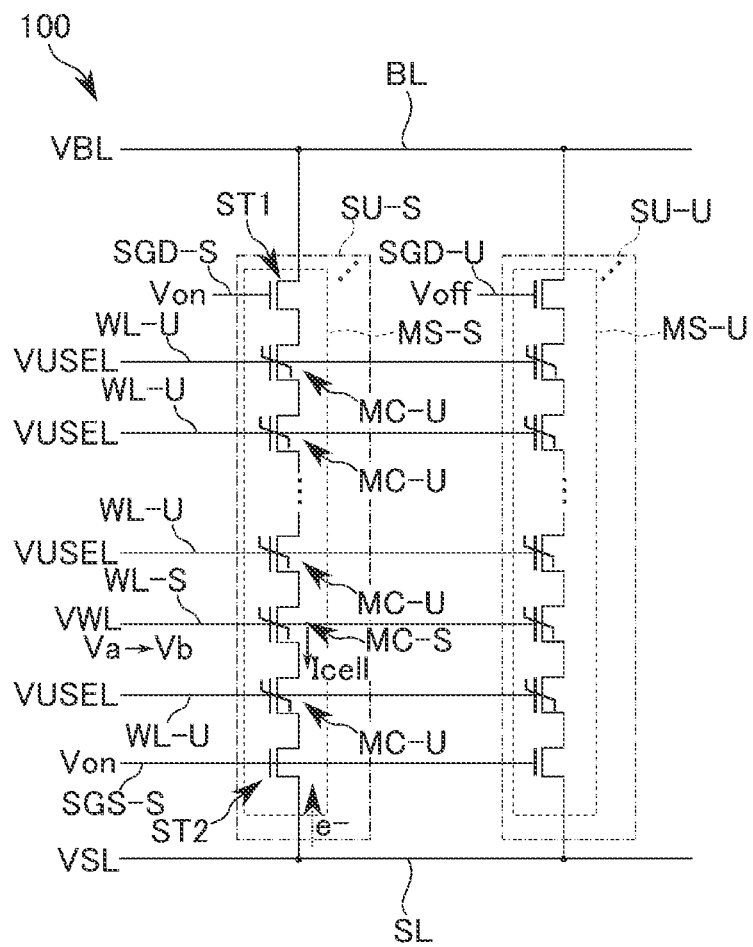
FIG. 11 is a diagram illustrating a read sequence of a memory device according to a first embodiment.

FIG. 11 is a schematic diagram illustrating a potential state (applied voltage) of each wiring in the read sequence of the memory device 1 according to the embodiment.

Figure 12:
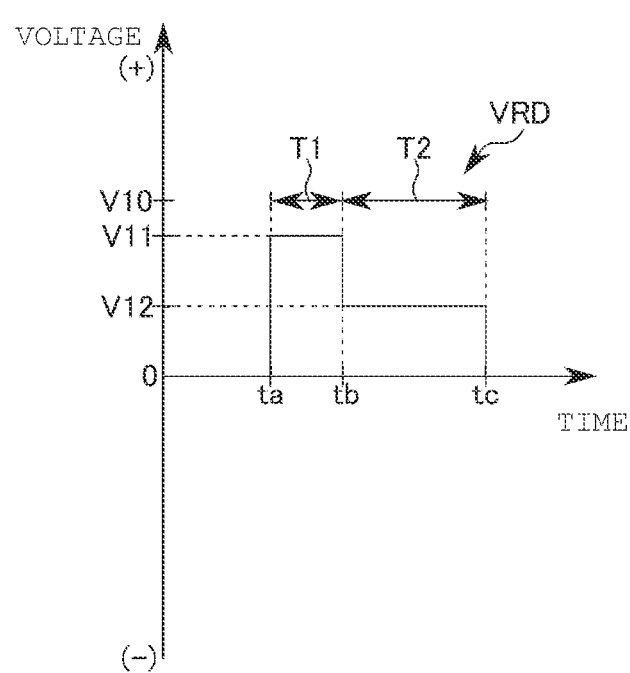
FIG. 12 is a diagram illustrating a read sequence of a memory device according to a first embodiment.

FIG. 12 is a waveform diagram illustrating the read pulse (read voltage) used in the read sequence of the memory device 1 according to the embodiment. In FIG. 12, the horizontal axis of a graph corresponds to time, and the vertical axis of the graph corresponds to voltage value.

During the execution of the read sequence, the memory controller 2 transmits a read command CMD and the address ADD to the memory device 1.

The memory device 1 executes the read sequence on a region in the memory cell array 100 indicated by the address ADD based on the read command CMD.

During the read sequence, the string unit SU and the block BLK including the selected cell MC that is a data read target are set to the selected state, respectively.

The read sequence is executed in units of a page.

As illustrated in FIG. 11, the driver circuit 160 applies a bit line voltage VBL to the bit line BL. When the read sequence is executed in units of a page, a plurality of the bit lines BL belonging to the selected page in a selected string unit SU-S are set to the selected state by applying the bit line voltage VBL. The bit line voltage VBL has the positive voltage value. For example, the voltage value of the bit line voltage VBL is about 0.5 V.

It is noted that only a predetermined number or group of bit lines BL among all the bit lines BL may be set to the selected state according to the data reading method.

The driver circuit 160 applies a source line voltage VSL to the source line SL (and the semiconductor layer 41). The voltage value of the source line voltage VSL is, for example, the ground voltage (0 V).

The driver circuit 160 applies a voltage Von to a drain-side select gate line SGD-S of the selected string unit SU-S. The potential difference between the select voltage Von and the bit line voltage VBL is set to a potential difference allowing the drain-side select transistor ST1 connected to the bit line BL to be turned on. For example, the voltage value of the select voltage Von is about 3 V.

Accordingly, a plurality of the select transistors ST1 connected to the selected drain-side select gate line SGD-S are turned on.

A selected string MS-S corresponding to the selected drain-side select gate line SGD-S is electrically connected to the bit line BL via the select transistor ST1 in the on state.

The driver circuit 160 applies the voltage Von to the source-side select gate line SGS. Accordingly, the select transistor ST2 connected to the select gate line SGS is turned on.

The selected string MS-S connected to the source-side select gate line SGS is electrically connected to the source line SL (and the semiconductor layer 41) via the select transistor ST2 in the on state.

The driver circuit 160 applies a voltage Voff to a non-selected drain-side select gate line SGD-U of a non-selected string unit SU-U. The voltage Voff is, for example, 0 V.

Accordingly, the select transistor ST1 connected to the non-selected drain-side select gate line SGD-U is turned off.

A non-selected string MSU connected to the non-selected drain-side select gate line SGD-U is electrically isolated from the bit line BL by the select transistor ST1 in the off state.

Thus, in the memory device 1 according to the embodiment, the string unit SU-S to which the group (selected page) including one or more selected cells MC-S belongs can be selectively activated by controlling the potentials of the drain-side and source-side select gate lines SGD and SGS in the selected block.

In the selected block, a non-select voltage VUSEL is applied to non-selected word lines WL-U. Accordingly, based on the potential difference between the non-select voltage VUSEL and the voltage VBL, the read pass voltage VREAD is applied between the channel and the gate of a non-selected cell MC-U connected to the non-selected word line WL-U. Therefore, the non-selected cells MC-U are turned on independently of the data stored in the non-selected cells MC-U.

The driver circuit 160 supplies a read pulse VRD of FIG. 12 to the selected cell MC-S. The read pulse VRD is applied between the gate and the channel (memory pillar 60) of the selected cell MC-S.

As illustrated in FIG. 12, in the memory device 1 according to the embodiment, the read pulse VRD has a stepped pulse waveform including two voltage values V11 and V12 for the two different voltage steps.

The read pulse VRD has the first voltage value V11 during a first period T1 from time ta to time tb.

In the period T1, the driver circuit 160 applies a voltage VWL having a positive voltage value Va to a selected word line WL-S. Therefore, the potential of the selected word line voltage VWL is set to the voltage value Va. The voltage value Va is, for example, about 4 V.

In the period T1, the potential difference between the voltage value Va and the bit line voltage VBL corresponds to the voltage value V11.

The read pulse VRD has the second voltage value V12 different from the first voltage value V11 during a second period T2 from time tb to time tc after the first period T1.

In the embodiment, an absolute value of the voltage value V12 is smaller than an absolute value of the voltage value V11. The absolute value of the voltage value V11 is higher than the absolute value of the voltage value V12 but smaller than an absolute value of the voltage value V10 of the write pulse VWR.

The driver circuit 160 changes the voltage value of the selected word line voltage VWL from the voltage value Va to a voltage value Vb at time tb. The potential (voltage value) of the word line WL is reduced from the voltage value Va to the voltage value Vb. Accordingly, the selected word line voltage VWL is set to the voltage value Vb. The voltage value Vb is, for example, about 1.5 V.

In the period T2, the potential difference between the voltage value Vb and the bit line voltage VBL corresponds to the voltage value V12.

Thus, in the period T2, the read pulse VRD having the voltage value V12 is applied between the gate and the channel of the selected cell MC.

The period T1 is shorter than the period T2. The period T1 is shorter than a supply period (pulse width) T0 of the write pulse VWR. However, the period T1 may be the same as the period T2.

A magnitude of the voltage value V11 and a length of the period T1 can be appropriately set in a range that satisfies the above relationship.

Generally, when the voltage value V11 is increased, the length of the period T1 can be shortened.

It is noted that time ta corresponds to the timing of a rising edge of the read pulse VRD. Time tb corresponds to the timing of change in the voltage value of the read pulse VRD. Time tc corresponds to the timing of a falling edge of the read pulse VRD.

In the following, the period T1 in which the read pulse VRD has the voltage value V11 is also referred to as a weak program period. The period T2 in which the read pulse VRD has the voltage value V12 is also referred to as a sense period.

In the period T2, the voltage value V12 of the read pulse VWR is set to a voltage value (for example, the voltage value VR) between the two threshold voltage distributions D1a and D2a in FIG. 8A with respect to the memory cell MC storing the 1-bit data.

When a threshold voltage of the selected cell MC-S is equal to or lower than the voltage value V12, the selected cell MC-S is turned on. In this case, the bit line BL is electrically connected to the source line SL via the selected cell MC-S in the on state (and the non-selected cell MC-U in the on state and the select transistors ST1 and ST2 in the on state). As a result, a cell current Icell flows between the bit line BL and the source line SL via the selected string MS-S.

When the threshold voltage of the selected cell MC-S is higher than the voltage value V12, the selected cell MC-S is turned off. In this case, the bit line BL is electrically isolated from the source line SL by the selected cell MC-S in the off state. As a result, no cell current Icell flows between the bit line BL and the source line SL.

The sense amplifier circuit 150 senses whether the cell current Icell is generated. The sense amplifier circuit 150 amplifies a signal (cell signal) in accordance with the sensed result.

The sense amplifier circuit 150 determines data in the selected cell MC-S based on the sensed result of the cell signal. The sense amplifier circuit 150 outputs a signal based on the determination as the data in the selected cell MC-S.

Accordingly, the read data from the selected cell MC-S can be transferred from the memory device 1 to the memory controller 2.

It is noted that the sense amplifier circuit 150 may determine the data in the selected cell MC-S based on the detection of a change in the potential of the bit line BL in accordance with the cell current.

After acquiring the sensed result, the supplying of the read pulse VRD is stopped.

The driver circuit 160 applies the voltage of 0 V to the selected and non-selected word lines WL. The driver circuit 160 applies the voltage of 0 V to the bit line BL and the source line SL. After that, the driver circuit 160 applies the voltage of 0 V to the selected and non-selected select gate lines SGD and SGS.

During the read sequence, in the block BLK in the non-selected state, the potential state of the non-selected word line WL is set to a floating state. In the string unit SU of the block BLK in the non-selected state, the voltage Voff is applied to the drain-side and source-side select gate lines SGD and SGS. Accordingly, during the read sequence, the memory cell strings MS in the blocks BLK in the non-selected state are electrically isolated from the bit line BL and the source line SL.

As described above, the read sequence of the memory device 1 according to the embodiment is completed.

It is noted that, in the embodiment, a voltage pulse having the same pulse shape as the read pulse VRD may also be used as the verification pulse VVFY in the write sequence.

(c) Mechanism

A mechanism of the read sequence of the memory device 1 according to the embodiment will be described with reference to FIGS. 13A, 13B, 13C.

Figure 13A:
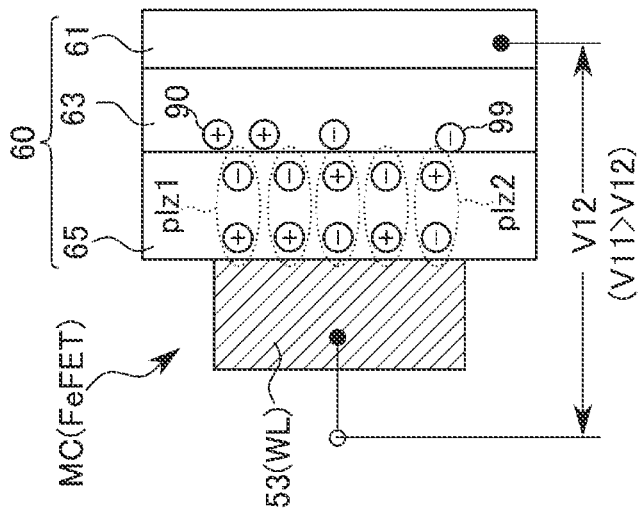
FIGS. 13A to 13C are diagrams illustrating aspects related to a read sequence of a memory device according to a first embodiment.
Figure 13B:
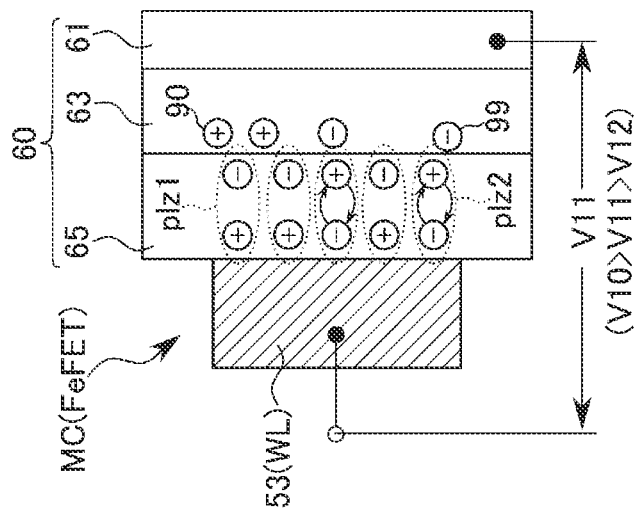
Figure 13C:
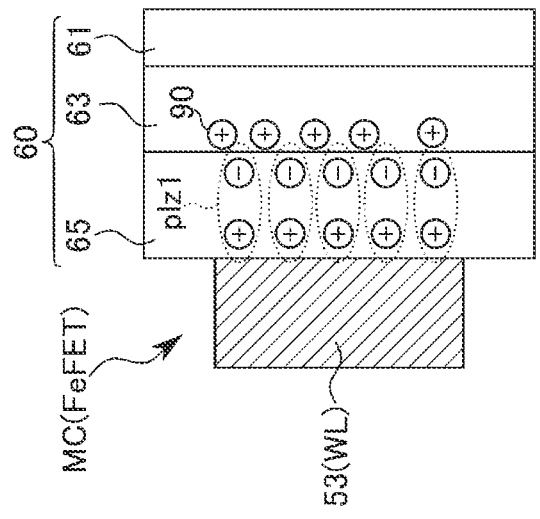

FIGS. 13A to 13C are schematic diagrams illustrating the mechanism of the read sequence (read operation) of the memory device 1 according to the embodiment.

As illustrated in FIGS. 13A to 13C, the ferroelectric layer 65 includes spontaneous polarizations (electric dipoles) plz1 and plz2.

As described above, the orientation of the spontaneous polarization in the ferroelectric layer 65 is aligned with the orientation in accordance with the data stored in the memory cell MC. However, the spontaneous polarizations have variations in characteristics. For example, the ferroelectric layer 65 may contain a few spontaneous polarizations with the orientations different from the orientation of the spontaneous polarizations in accordance with the stored data.

Therefore, the polarization of the ferroelectric layer 65 appears as an overall tendency of the polarization states of the spontaneous polarizations plz1 and plz2.

As illustrated in FIG. 13A, a certain ferroelectric transistor MC (selected cell) stores data corresponding to the erased state.

In the ferroelectric transistor MC in the erased state, the ferroelectric layer 65 includes a plurality of the spontaneous polarizations plz1 (up state).

Holes 90 are accumulated between the ferroelectric layer 65 and the insulating layer 63 due to the spontaneous polarization plz1 (up state). Due to the accumulation of the holes 90, the threshold voltage of the ferroelectric transistor MC in the erased state is reduced.

As illustrated in FIG. 13B, in the read sequence, the read pulse VRD having the pulse waveform of FIG. 12 is applied to the ferroelectric transistor MC including the ferroelectric layer 65.

In the period T1 of the read pulse VRD, a voltage pulse VRD having the voltage value V11 is applied between the gate and the channel of the ferroelectric transistor MC. The absolute value of the voltage value V11 is smaller than the absolute value of the voltage value V10 and larger than the absolute value of the voltage value V12. It is desirable that the voltage value V11 is a positive voltage value at which the spontaneous polarization reversal having a relatively low polarization reversal threshold voltage among the plurality of the spontaneous polarizations plz1 in the ferroelectric layer 65 can occur.

In the ferroelectric transistor MC in the erased state, with respect to a spontaneous polarization plzx having a low polarization reversal threshold voltage among the plurality of spontaneous polarizations of the ferroelectric layer 65, the spontaneous polarization plzx is reversed by the application of a voltage having the voltage value V11. Accordingly, the spontaneous polarization plz1 (up state) is changed to the spontaneous polarization plz2 (down state) in the spontaneous polarization with the low polarization reversal threshold voltage.

It is noted that the change in the polarization in the ferroelectric layer 65 from the up state to the down state by the read pulse VRD is a partial change with respect to the spontaneous polarization with the low polarization reversal threshold voltage, and the ferroelectric transistor MC in the erased state can still be maintained.

Trapped electrons are temporarily generated between the ferroelectric layer 65 and the insulating layer 63 (interface layer) in the region including the spontaneous polarization plz2 (down state). As a result, electrons 99 are accumulated between the ferroelectric layer 65 and the insulating layer 63.

At time tb in FIG. 12, the voltage value of the read pulse VRD is reduced from the voltage value V11 to the voltage value V12.

The electrons 99 continue to be accumulated between the ferroelectric layer 65 and the insulating layer 63 without being de-trapped in the period T2 in which the voltage having the voltage value V12 is applied.

Due to the influence of the accumulated electrons 99, the threshold voltage of the ferroelectric transistor MC in the erased state is temporarily increased. Accordingly, an unintended decrease in the threshold voltage of the ferroelectric transistor MC in the erased state is prevented.

In the period T2, the cell signal (the presence or absence of current generation) of the ferroelectric transistor MC for which the threshold voltage is temporarily increased is sensed by the sense amplifier circuit 150.

As a result, the sensed cell signal is not influenced by the unintended decrease in the threshold voltage of the ferroelectric transistor MC in the erased state.

After the application of the read pulse VRD is stopped at time tc, the electrons 99 between the ferroelectric layer 65 and the insulating layer 63 are de-trapped. Therefore, the electrons 99 are emitted from the interface between the ferroelectric layer 65 and the insulating layer 63 to the semiconductor layer 61.

For example, by stopping the application of the read pulse VRD, the reversed spontaneous polarization returns from the down state to the up state.

Thus, a read margin of the memory cell can be improved by temporarily increasing the threshold voltage of the ferroelectric transistor MC.

It is noted that, in the ferroelectric transistor MC in the programmed state, most of the plurality of spontaneous polarizations of the ferroelectric layer 65 are in the down state.

Therefore, in the ferroelectric transistor MC in the programmed state, even when a very few of the spontaneous polarizations in the ferroelectric layer 65 are changed from the up state to the down state due to the application of the voltage having the voltage value V11, the effect of electron trapping due to the spontaneous polarization reversal is small.

Accordingly, when the read pulse VRD having a pulse shape of FIG. 12 is applied to the ferroelectric transistor MC in the programmed state, the data corresponding to the programmed state can be read from the ferroelectric transistor MC without the influence caused by the application of the voltage having the voltage value V11.

(d) Summary

In the ferroelectric memory using the ferroelectric transistor (FeFET) as a memory cell, data storage is executed by a write cycle including the erase sequence and the write sequence. As the number of write cycles increases, a phenomenon occurs in which the threshold voltage of the ferroelectric transistor in the erased state is reduced.

In the ferroelectric memory, the read margin of the memory device is determined by the difference between the threshold voltage of the ferroelectric transistor in the erased state and the threshold voltage of the ferroelectric transistor in the programmed state.

Therefore, when the threshold voltage of the ferroelectric transistor in the erased state is reduced, the read margin deteriorates.

In the embodiment, the read pulse VRD includes the first voltage value V11 period and the second voltage value V12 period, with the second voltage value V12 being lower (smaller) than the first voltage value V11.

The threshold voltage of the ferroelectric transistor MC in the erased state is temporarily increased during the sensing period of the cell signal from the ferroelectric transistor MC while maintaining the erased state by the application of the voltage having the voltage value V11.

As a result, the memory device 1 according to the embodiment can prevent the read margin from deteriorating.

Therefore, in the memory device according to the embodiment, the reliability can be improved.

(2) Second Embodiment

A memory device according to a second embodiment will be described with reference to FIGS. 14 to 16.

A read pulse VRD including a first voltage value and a second voltage value may be supplied to a ferroelectric memory that operates by a mechanism different from the mechanism of the ferroelectric memory according to the first embodiment.

The memory device 1 according to the second embodiment uses antiferroelectric characteristics of the ferroelectric layer 65 of the ferroelectric transistor MC.

Figure 14:
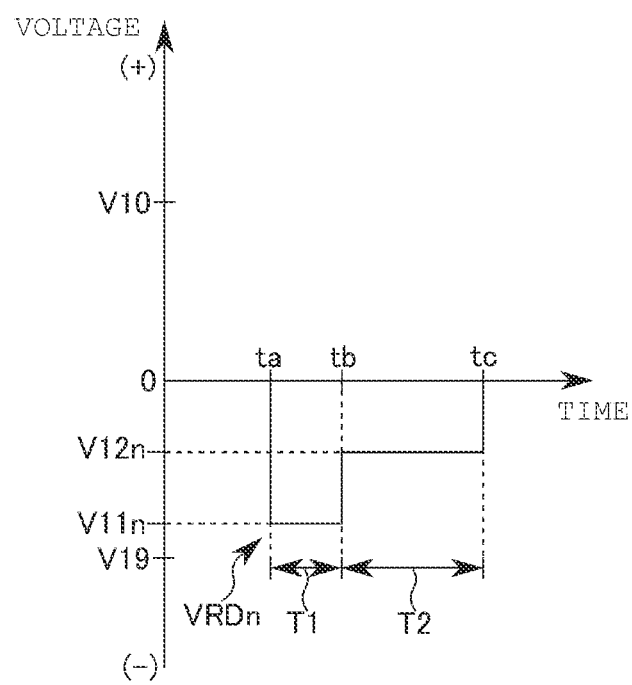
FIG. 14 is a diagram illustrating a read sequence of a memory device according to a second embodiment.
Figure 15:
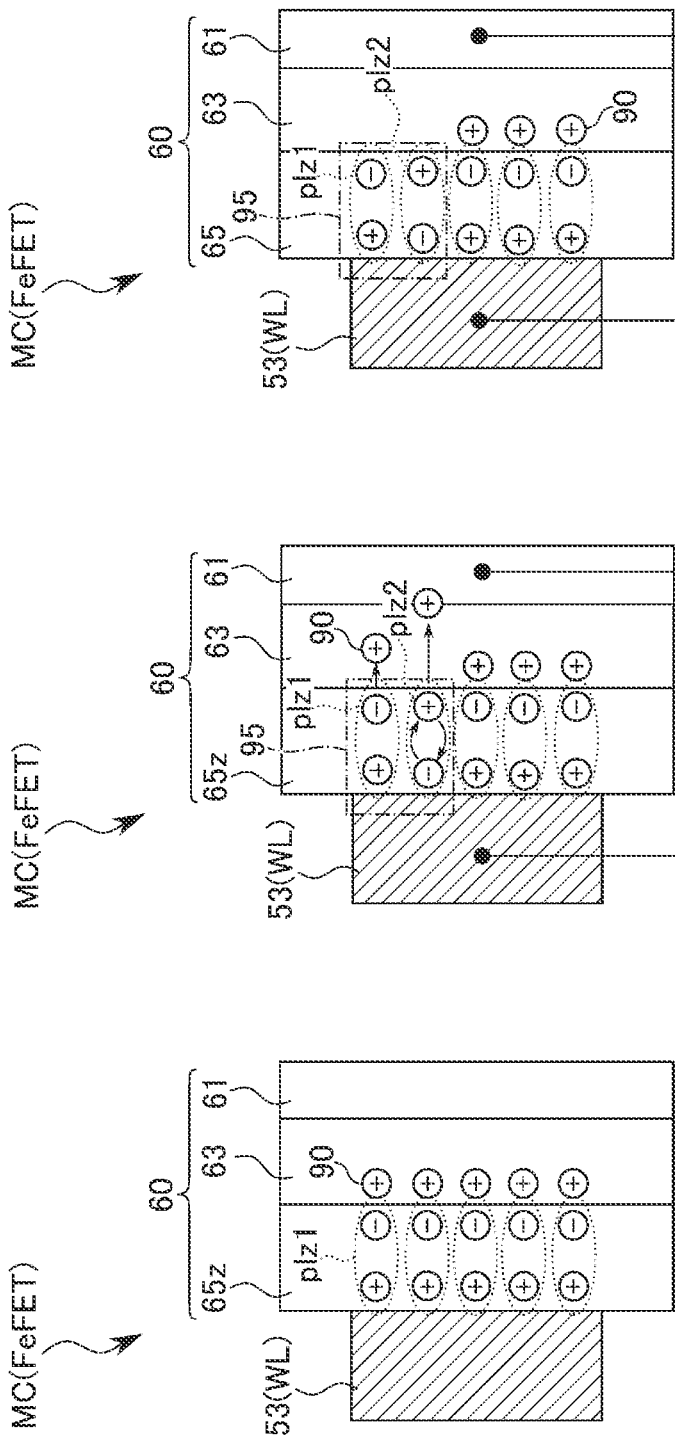
FIGS. 15A to 15C are diagrams illustrating aspects related to a read sequence of a memory device according to a second embodiment.

FIG. 14 is a waveform diagram illustrating a read pulse (read voltage) used in a read sequence of the memory device 1 according to the second embodiment. In FIG. 14, the horizontal axis of a graph corresponds to time, and the vertical axis of the graph corresponds to voltage value.

As illustrated in FIG. 14, in the second embodiment, a read pulse VRDn with a negative polarity is supplied to the selected cell MC during the read sequence.

The read pulse VRDn has a first voltage value V11$n$ and a second voltage value V12$n$.

Each of the voltage value V11$n$ and the voltage value V12$n$ has a negative voltage value. The voltage value V11$n$ is lower than the voltage value V12$n$. An absolute value of the voltage value V11$n$ is larger than an absolute value of the voltage value V12$n$.

For example, the absolute value of the voltage value V11$n$ is smaller than an absolute value of a voltage value V19 of an erase pulse VERA.

In a period T1 of the read pulse VRDn, the voltage value V11$n$ is applied between a gate and a channel of the selected cell MC. In a period T2 of the read pulse VRDn, the voltage value V12$n$ is applied between the gate and the channel of the selected cell MC.

In a state in which a voltage pulse with the same polarity as the above-described erase pulse VERA is applied to the ferroelectric transistor MC, the effective electric field in the ferroelectric transistor MC in the erased state is larger than the effective electric field in the ferroelectric transistor MC in the programmed state.

FIGS. 15A, 15B, 15C are schematic diagrams illustrating a mechanism of the memory device 1 according to the second embodiment.

As illustrated in FIGS. 15A to 15C, in the ferroelectric transistor MC with the antiferroelectric characteristics, a ferroelectric layer 65$z$ contains a certain concentration of zirconium in hafnium dioxide.

As illustrated in FIG. 15A, as a model of the polarization of the ferroelectric layer 65$z$ in the ferroelectric transistor MC in the erased state, the holes 90 are accumulated between the ferroelectric layer 65$z$ and the insulating layer 63 due to the influence of spontaneous polarization plz1. A threshold voltage of the ferroelectric transistor MC in the erased state is reduced due to the accumulated holes 90.

As illustrated in FIG. 15B, in the second embodiment, during the application of the voltage pulse VRDn having the first voltage value V11$n$, an antiferroelectric phase 95 is formed in the ferroelectric layer 65$z$. In the antiferroelectric phase 95, two spontaneous polarizations plz1 and plz2 in different polarization states are adjacent to each other in antiparallel.

In the region where the antiferroelectric phase 95 is formed, the holes 90 leave the portion between the ferroelectric layer 65z and the insulating layer 63. Therefore, in the ferroelectric transistor MC in the erased state including the antiferroelectric phase 95, excessive holes 90 (trapped holes) are less likely to occur between the ferroelectric layer 65z and the insulating layer 63.

As a result, an unintended decrease in the threshold voltage of the ferroelectric transistor MC in the erased state is prevented.

As illustrated in FIG. 15C, during the application of the voltage pulse VRDn having the voltage value V12n, the antiferroelectric phase 95 is maintained in the ferroelectric layer 65z. With the antiferroelectric phase 95 maintained, the cell signal of the ferroelectric transistor MC is sensed.

Therefore, the sensed cell signal is not influenced by the unintended decrease in the threshold voltage of the ferroelectric transistor MC in the erased state.

Figure 16:
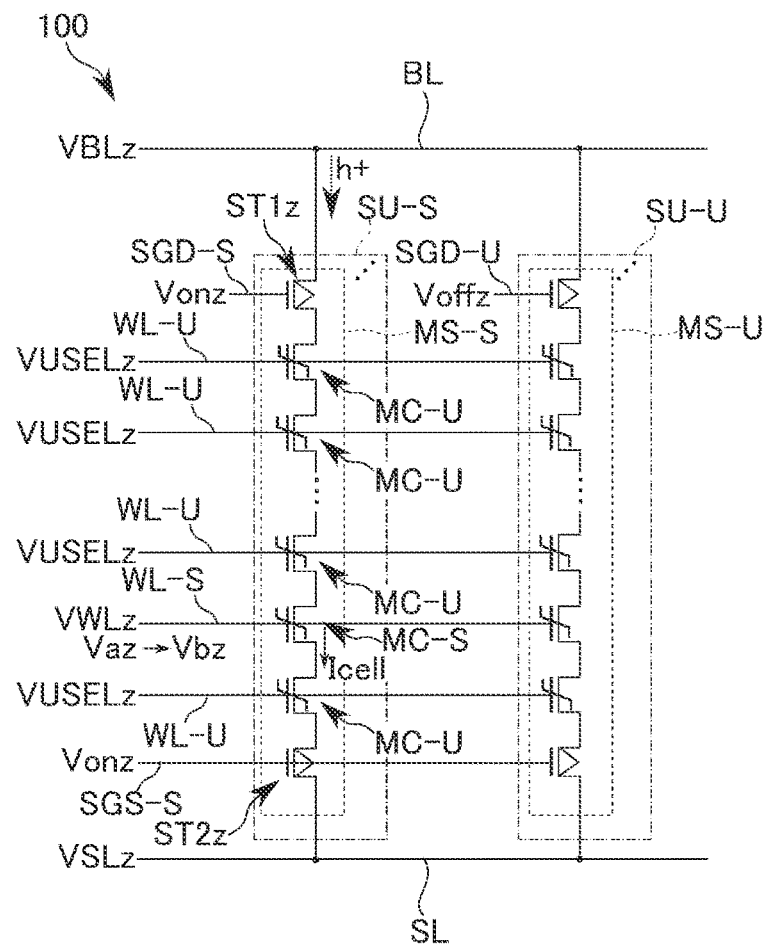
FIG. 16 is a diagram illustrating a read sequence of a memory device according to a second embodiment.

FIG. 16 is a schematic diagram illustrating the potential state (applied voltage) of each wiring in the read sequence of the memory device 1 according to the second embodiment. As illustrated in FIG. 16, select transistors ST1z and ST2z are p-channel field effect transistors.

In the read sequence of the memory device 1 according to the second embodiment, the order of the voltage applied to each wiring is substantially the same as the read sequence of the memory device 1 according to the first embodiment. However, in the second embodiment, the voltage (potential) applied to the wiring is different from that in the read sequence (refer to FIG. 12) of the memory device 1 according to the first embodiment.

In the read sequence, the driver circuit 160 supplies a bit line voltage VBLz to the bit line BL. The bit line voltage VBLz has a positive voltage value. For example, the voltage value of the bit line voltage VBLz is about 5 V.

The driver circuit 160 supplies a source line voltage VSLz to the source line SL. For example, the source line voltage VSLz has a voltage value smaller than the bit line voltage VBLz.

The driver circuit 160 supplies a voltage Vonz to the selected select gate line SGD-S. The voltage Vonz has a positive voltage value smaller than the bit line voltage VBLz. For example, the voltage value of the voltage Vonz is about 2 V.

Accordingly, the p-channel select transistor ST1z in the selected string unit SU-S is turned on.

The driver circuit 160 supplies a voltage Voffz to the non-selected select gate line SGD-U. The voltage Voffz has, for example, substantially the same voltage value as the bit line voltage VBLz. For example, the voltage value of the voltage Voffz is about 5 V.

Accordingly, the p-channel select transistor ST1z in the non-selected string unit SU-U is turned off.

The driver circuit 160 supplies the voltage Vonz to the select gate line SGS. The voltage Vonz has a positive voltage value smaller than the source line voltage VSLz.

Accordingly, the select transistor ST2z is turned on.

The driver circuit 160 applies a non-select voltage VUSELz to the non-selected word lines WL-U. The non-select voltage VUSELz has a positive voltage value. The voltage value of the non-select voltage VUSELz is, for example, about 2 V.

Accordingly, the non-selected cells connected to the non-selected word lines WL-U are turned on.

The driver circuit 160 supplies a voltage value Vaz to the selected word line WL-S at time ta. The voltage value Vaz has a positive voltage value smaller than the bit line voltage VBLz. For example, the voltage value Vaz is about 1 V.

Accordingly, a voltage pulse with a negative polarity is applied between the gate and the channel of the selected cell MC-S as the read pulse VRDn.

The voltage value V11n corresponds to the potential difference between the bit line voltage VBLz and the voltage value Vaz. For example, the voltage value V11n is about −4 V.

As described with reference to FIGS. 15A to 15C, due to the application of the voltage pulse with a negative polarity, the antiferroelectric phase 95 occurs in the ferroelectric layer 65z.

Accordingly, the generation of holes 90 in the ferroelectric layer 65 is prevented.

As a result, in the second embodiment, due to the antiferroelectric phase 95 formed in the ferroelectric layer 65z, the threshold voltage of the ferroelectric transistor MC-S of the selected cell is temporarily increased.

After the period T1 has elapsed, at time tb the driver circuit 160 changes a potential of a selected word line WLS from the voltage value Vaz to a voltage value Vbz. The voltage value Vbz is a positive voltage value higher than the voltage value Vaz and lower than the voltage VBLz. The voltage value Vbz is, for example, about 3.5 V.

The voltage pulse VRDn with a negative polarity is applied between the gate and the channel of the selected cell MC-S. During the application of the voltage pulse VRDn, the antiferroelectric phase 95 is maintained in the ferroelectric layer 65.

The voltage value V12n corresponds to the potential difference between the bit line voltage VBLz and the voltage value Vbz. For example, the voltage value V11n is about −1.5 V.

In the period T2, when the selected cell MC-S is turned on, the holes as carriers move from the bit line BL to the source line SL as the cell current Icell.

Similarly to the first embodiment, the sense amplifier circuit 150 senses whether a current is generated in accordance with on/off of the selected cell MC-S in the period T2.

Therefore, the sense amplifier circuit 150 determines the data in the selected cell MC-S.

After acquiring the sensed result, the supplying of the read pulse VRD is stopped. At time tc, the driver circuit 160 supplies a voltage of 0 V to the selected word line WL-S. In addition, the driver circuit 160 supplies the voltage of 0 V to the select gate lines SGD and SGS, the non-selected word lines WL-U, the bit lines BL, and the source lines SL.

As described above, the read sequence of the memory device according to the second embodiment is completed.

In the second embodiment, the write sequence and the erase sequence of the memory device 1 are substantially the same as the respective sequences of the first embodiment. Therefore, additional description of the write sequence and the erase sequence is omitted for the second embodiment. However, the polarity of the voltage pulse used in the write sequence or the erase sequence according to the embodiment may be different from the polarity of the voltage pulse used in the first embodiment.

In the memory device 1 according to the second embodiment, the read pulse VRDn with a negative polarity having the two voltage values V11n and V12n is supplied to the selected cell MC-S.

In the second embodiment, the antiferroelectric phase 95 is formed in the ferroelectric layer 65 by applying the voltage value V11n having a relatively large absolute value. Due to the antiferroelectric phase 95, the occurrence of excessive holes in the ferroelectric layer 65 is prevented.

Accordingly, the threshold voltage of the ferroelectric transistor MC in the erased state is temporarily increased.

As a result, in the memory device 1 according to the embodiment, the read margin can be improved.

When, as in the second embodiment, the antiferroelectric characteristics contribute to the operation of the ferroelectric transistor MC, the polarization reversal threshold voltage is reduced, and thus, write cycle resistance is improved.

As described above, in the memory device 1 according to the second embodiment, the reliability can be improved.

(3) Third Embodiment

A memory device according to a third embodiment will be described with reference to FIG. 17.

Figure 17:
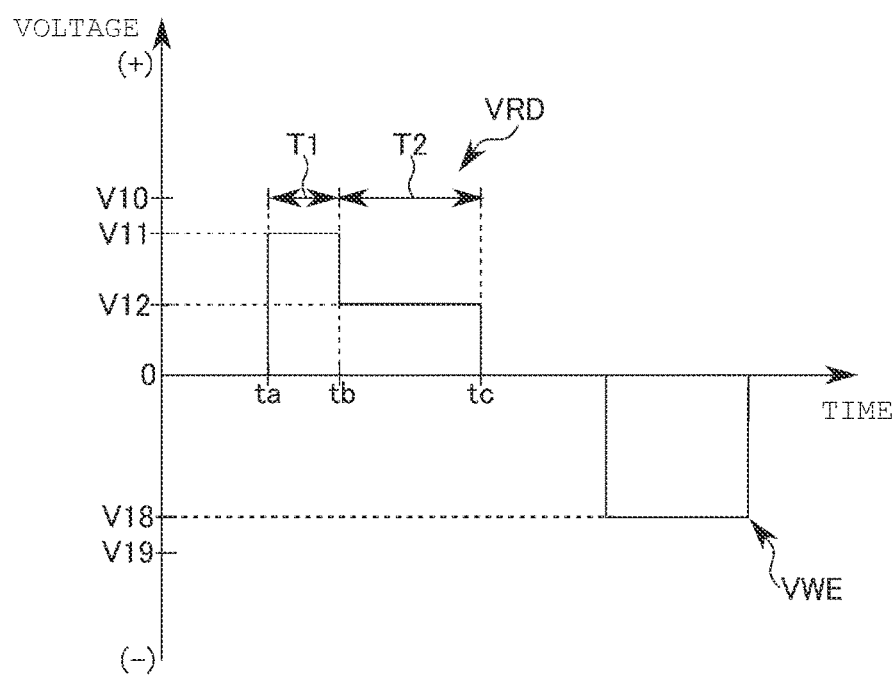
FIG. 17 is a diagram illustrating a read sequence of a memory device according to a third embodiment.

FIG. 17 is a schematic diagram illustrating a read sequence of the memory device 1 according to the third embodiment.

As illustrated in FIG. 17, in the read sequence, after the supplying of the read pulse VRD, a voltage pulse VWE with a polarity different from that of the read pulse VRD is supplied to the selected cell MC-S.

For example, when a voltage pulse VRD with a positive polarity is supplied to the selected cell MC-S, in the read sequence, a voltage pulse VWE with a negative polarity is supplied to the selected cell MC-S after the supplying of the read pulse VRD. The voltage pulse VWE has a negative voltage value V18.

The absolute value of the voltage value V18 of the voltage pulse with a negative polarity weak erase pulse VWE is smaller than the absolute value of the voltage value V19 of the erase pulse VERA.

In the following, the supplying of the voltage pulse VWE with a negative polarity is referred to as a weak erasing operation.

For example, the supply period (pulse width) of the weak erase pulse VWE is equal to or shorter than the supply period of the erase pulse VER.

The weak erase pulse VWE is supplied when the sense result of the cell signal by supplying the read pulse VRD is a value in accordance with the ferroelectric transistor MC in the erased state.

When the sensed result of the cell signal is a value in accordance with the ferroelectric transistor MC in the programmed state, the weak erase pulse VWE is not supplied to the ferroelectric transistor MC in the programmed state after the supplying of the read pulse VRD.

For example, the supplying of the weak erase pulse VWE can be controlled for each memory cell MC by controlling the potential of each bit line BL.

During the weak erasing operation, a smaller positive voltage is applied to the bit line BL to which the ferroelectric transistor MC in the programmed state is connected. Accordingly, an absolute value of a gate-channel potential difference of the ferroelectric transistor MC in the programmed state becomes smaller than the absolute value of the voltage value V18 of the weak erase pulse VWE. As a result, the spontaneous polarization reversal (weak erasing of data) does not occur in the ferroelectric transistor MC in the programmed state.

In the third embodiment, the supplying of the weak erase pulse VWE allows re-reversal (restoration) of the polarization from the down state to the up state at a certain spontaneous polarization in the ferroelectric layer 65 in the erased state and emission of electrons stored (trapped) in the ferroelectric transistor MC to occur.

Accordingly, in the third embodiment, the ferroelectric layer 65 in the erased state is returned to the state before the supplying of the read pulse VRD.

As described above, in the memory device according to the third embodiment, the reliability of the memory device can be improved.

(4) Fourth Embodiment

A memory device according to a fourth embodiment will be described with reference to FIG. 18.

An amount of decrease in a threshold voltage of the ferroelectric transistor MC in the erased state can be changed according to the number of write cycles.

Generally, the amount of decrease in the threshold voltage of the ferroelectric transistor MC in the erased state is increased according to increases in the number of write cycles.

The magnitude of a voltage value V11 of a read pulse VRD may be adjusted according to the number of write cycles.

Figure 18:
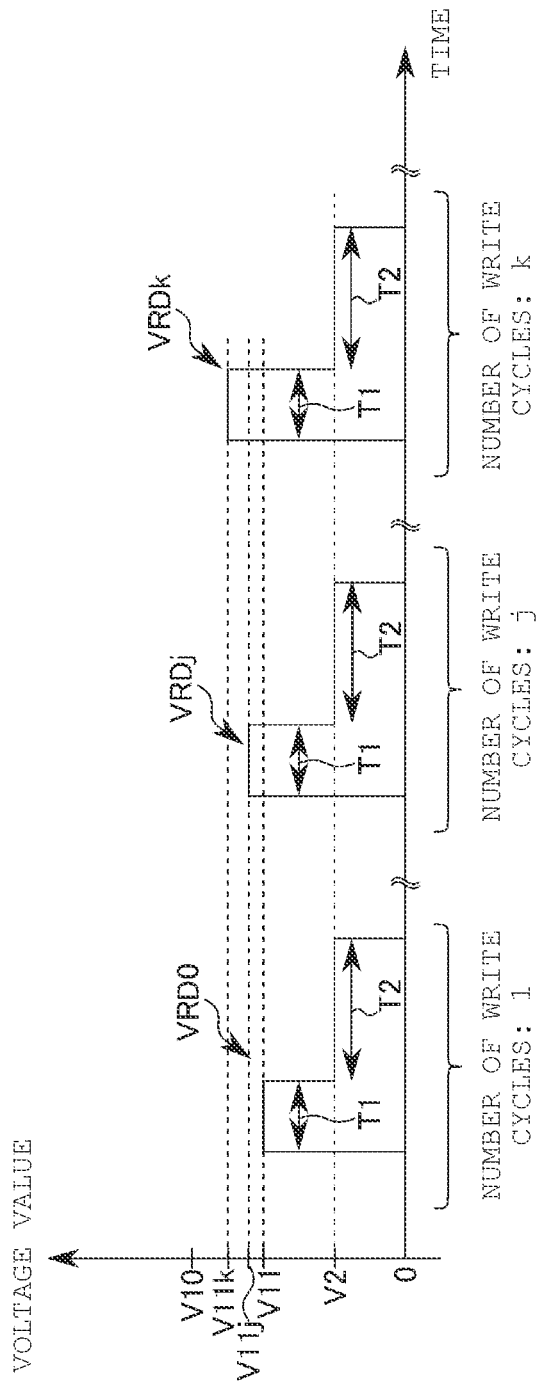
FIG. 18 is a diagram illustrating a read sequence of a memory device according to a fourth embodiment.

FIG. 18 is a diagram illustrating a waveform of the read pulse VRD in accordance with the write cycle in the memory device 1 according to the fourth embodiment.

As illustrated in FIG. 18, in an initial state of the setting of the read sequence, the read pulse VRD has the voltage value V11.

After the number of write cycles has increased, the magnitude of the voltage value V11 of the read pulse VRD is increased according to the use of the memory device 1.

For example, when j (j is a natural number) write cycles have been executed, a read pulse VRDj has a voltage value V11j in a period T1. The voltage value V11j is larger (higher) than the voltage value V11.

For example, when k (k is a natural number larger than j) write cycles have been executed, the read pulse VRD has a voltage value V11k in the period T1. The voltage value V11k is larger than the voltage value V11j.

However, the voltage values V11j and V11k are still smaller than a voltage value V0 of the write pulse VWR.

It is noted that read pulses VRD0, VRDj, and VRDk have the same length of period T1. The read pulses VRD0, VRDj, and VRDk have the same magnitude of the voltage value V2. In addition, the read pulses VRD0, VRDj, and VRDk have the same the length of the period T2. However, in other examples, the length of the period T1 may be changed according to the increases of in voltage value V11 for each of the read pulses VRD0, VRDj, and VRDk.

Thus, by increasing the voltage values V11, V11j, and V11k of the read pulse VRD, the influence of the unintended decrease in the threshold voltage of the ferroelectric transistor MC in the erased state in accordance with additional (accumulated) write cycles is prevented.

As described above, in the memory device 1 according to the fourth embodiment, the reliability of the memory device can be improved.

(5) Others

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory device, comprising:
a first conductive layer above a substrate in a first direction;
a second conductive layer between the first conductive layer and the substrate;
a third conductive layer between the first conductive layer and the second conductive layer;
a pillar extending in the first direction and including a ferroelectric layer, the pillar being adjacent to the first, second, and third conductive layers in a second direction perpendicular to the first direction;
a first transistor at an intersection of the first conductive layer and the pillar;
a second transistor at an intersection of the second conductive layer and the pillar;
a memory cell at an intersection of the third conductive layer and the pillar, the memory cell comprising a ferroelectric transistor; and
a circuit configured to supply a read pulse to the memory cell in a read sequence, wherein
the read pulse has:
a first voltage value in a first period, and
a second voltage value in a second period after the first period, the second voltage value having the same polarity as the first voltage value but an absolute magnitude smaller than an absolute magnitude of the first voltage value.

2. The memory device according to claim 1, wherein the read pulse is applied between a gate and a channel of the ferroelectric transistor.

3. The memory device according to claim 1, wherein the read pulse has a positive polarity.

4. The memory device according to claim 3, wherein
the circuit is further configured to supply a write pulse having a third voltage value with a positive polarity to the memory cell in a write sequence, and
the absolute magnitude of the first voltage value is smaller than an absolute magnitude of the third voltage value.

5. The memory device according to claim 3, wherein the circuit is configured to apply:
a first positive voltage to the first conductive layer, and
a second positive voltage to the pillar, the second positive voltage being smaller than the first positive voltage.

6. The memory device according to claim 1, wherein the read pulse has a negative polarity.

7. The memory device according to claim 6, wherein
the circuit is further configured to supply an erase pulse having a fourth voltage value with a negative polarity to the memory cell in an erase sequence, and
the absolute magnitude of the first voltage value is smaller than an absolute magnitude of the fourth voltage value.

8. The memory device according to claim 6, wherein the circuit is configured to apply:
a third positive voltage to the first conductive layer, and
a fourth positive voltage to the pillar, the fourth positive voltage being larger than the third positive voltage.

9. The memory device according to claim 1, wherein the circuit is further configured to supply:
an erase pulse with a first polarity to the memory cell in an erase sequence, and
a first pulse with the first polarity to the memory cell in the read sequence after application of the read pulse with a second polarity different from the first polarity, and
an absolute magnitude of the first pulse is smaller than an absolute magnitude of the erase pulse.

10. The memory device according to claim 1, wherein
the read pulse has the first voltage value in the read sequence before a first write cycle, and
a second read pulse has a fifth voltage value in a read sequence after the first write cycle, the fifth voltage value having an absolute magnitude larger than the absolute magnitude of the first voltage value.

11. A memory device, comprising:
a first conductive layer above a substrate in a first direction;
a second conductive layer between the first conductive layer and the substrate;
a third conductive layer between the first conductive layer and the second conductive layer;
a pillar extending in the first direction and including hafnium oxide, the pillar being adjacent to the first, second, and third conductive layers in a second direction perpendicular to the first direction;
a first transistor at an intersection of the first conductive layer and the pillar;
a second transistor at an intersection of the second conductive layer and the pillar;
a memory cell at an intersection of the third conductive layer and the pillar, the memory cell comprising a ferroelectric transistor; and
a circuit configured to supply a read pulse to the memory cell in a read sequence, wherein
the read pulse has:
a first voltage value in a first period, and
a second voltage value in a second period after the first period, the second voltage value having the same polarity as the first voltage value but an absolute magnitude smaller than an absolute magnitude of the first voltage value.

12. The memory device according to claim 11, wherein the read pulse has a positive polarity.

13. The memory device according to claim 12, wherein
the circuit is further configured to supply a write pulse having a third voltage value with a positive polarity to the memory cell in a write sequence, and
the absolute magnitude of the first voltage value is smaller than an absolute magnitude of the third voltage value.

14. The memory device according to claim 12, wherein the circuit is configured to apply:
a first positive voltage to the first conductive layer, and
a second positive voltage to the pillar, the second positive voltage being smaller than the first positive voltage.

15. The memory device according to claim 11, wherein the read pulse has a negative polarity.

16. The memory device according to claim 15, wherein
the circuit is further configured to supply an erase pulse having a fourth voltage value with a negative polarity to the memory cell in an erase sequence, and
the absolute magnitude of the first voltage value is smaller than an absolute magnitude of the fourth voltage value.

17. The memory device according to claim 15, wherein the circuit is configured to apply:
a third positive voltage to the first conductive layer, and
a fourth positive voltage to the pillar, the fourth positive voltage being larger than the third positive voltage.

18. The memory device according to claim 15, wherein the hafnium oxide contains zirconium.

19. The memory device according to claim 11, wherein the circuit is further configured to supply:
- an erase pulse with a first polarity to the memory cell in an erase sequence, and
- a first pulse with the first polarity to the memory cell in the read sequence after application of the read pulse with a second polarity different from the first polarity, and
- an absolute magnitude of the first pulse is smaller than an absolute magnitude of the erase pulse.

20. The memory device according to claim 11, wherein the read pulse has the first voltage value in the read sequence before a first write cycle, and a second read pulse has a fifth voltage value in a read sequence after the first write cycle, and
- an absolute magnitude of the fifth voltage value is larger than the absolute magnitude of the first voltage value.

* * * * *